United States Patent
Won et al.

(10) Patent No.: US 11,095,984 B2
(45) Date of Patent: Aug. 17, 2021

(54) DISPLAY DEVICE AND SOUND PROVIDING METHOD THEREOF

(71) Applicant: Samsung Display Co., LTD., Yongin-si (KR)

(72) Inventors: Byeong Hee Won, Incheon (KR); Jae Woo Im, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/803,451

(22) Filed: Feb. 27, 2020

(65) Prior Publication Data
US 2020/0389734 A1 Dec. 10, 2020

(30) Foreign Application Priority Data
Jun. 7, 2019 (KR) .......................... 10-2019-0067478

(51) Int. Cl.
| | |
|---|---|
| *H04R 5/04* | (2006.01) |
| *H04R 1/02* | (2006.01) |
| *H04R 3/04* | (2006.01) |
| *H04R 5/02* | (2006.01) |
| *H03F 3/183* | (2006.01) |
| *H04S 3/00* | (2006.01) |

(52) U.S. Cl.
CPC .............. *H04R 5/04* (2013.01); *H03F 3/183* (2013.01); *H04R 1/028* (2013.01); *H04R 3/04* (2013.01); *H04R 5/02* (2013.01); *H04S 3/008* (2013.01); *H03F 2200/03* (2013.01); *H04R 2499/15* (2013.01); *H04S 2400/01* (2013.01)

(58) Field of Classification Search
CPC . H04R 5/04; H04R 1/028; H04R 3/04; H04R 5/02; H04R 2499/15; H04R 1/323; H04S 3/008; H04S 2400/01; H03F 3/183; H03F 2200/03
USPC ........... 381/150, 98–99, 152, 306, 333, 388, 381/190–191
See application file for complete search history.

(56) References Cited

U.S. PATENT DOCUMENTS

| | | | |
|---|---|---|---|
| 7,769,191 B2 * | 8/2010 | Lee ........................... | H04R 1/26 381/152 |
| 10,171,910 B2 * | 1/2019 | Ashrafzadeh ............ | H04R 5/02 |

(Continued)

FOREIGN PATENT DOCUMENTS

| | | |
|---|---|---|
| JP | 2006-319626 | 11/2006 |
| JP | 2009-100223 | 5/2009 |

*Primary Examiner* — Disler Paul
(74) *Attorney, Agent, or Firm* — Kile Park Reed & Houtteman PLLC

(57) ABSTRACT

A display device includes a display panel including a substrate and a pixel array layer disposed on a first surface of the substrate; a first sound generator disposed on a second surface of the substrate, which is opposite to the first surface of the substrate, the first sound generator being configured to vibrate the display panel in accordance with a first sound signal to output first sound; and a second sound generator disposed on the second surface of the substrate, the second sound generator configured to vibrate the display panel in accordance with a second sound signal to output second sound, wherein the first sound includes both sound in a low-frequency range and sound in a high-frequency range, which is higher than the low-frequency range, and the second sound includes sound in the high-frequency range.

18 Claims, 25 Drawing Sheets

(56) References Cited

U.S. PATENT DOCUMENTS

| | | | |
|---|---|---|---|
| 10,200,772 B2* | 2/2019 | Ahn | G06F 1/1688 |
| 10,567,880 B2* | 2/2020 | Ham | H04R 1/025 |
| 10,754,372 B2* | 8/2020 | Lee | G06F 1/1605 |
| 2007/0223747 A1* | 9/2007 | Torisaki | H04R 1/24 |
| | | | 381/182 |
| 2018/0343521 A1* | 11/2018 | Ashrafzadeh | H04S 3/008 |
| 2019/0141456 A1* | 5/2019 | Dogiamis | B06B 1/0622 |
| 2019/0200111 A1* | 6/2019 | Kang | H04R 1/028 |
| 2019/0208300 A1* | 7/2019 | Lee | H04R 9/025 |

* cited by examiner

POLARIZATION DIRECTION

DISPLAY DEVICE AND SOUND PROVIDING METHOD THEREOF

CROSS-REFERENCE TO RELATED APPLICATION

This application claims priority to and benefits of Korean Patent Application No. 10-2019-0067478 under 35 U.S.C. § 119, filed in the Korean Intellectual Property Office on Jun. 7, 2019, the entire contents of which are incorporated herein by reference.

BACKGROUND

1. Technical Field

The disclosure relates to a display device and a sound providing method thereof.

2. Description of the Related Art

As the type and quantity of information that may be implemented for various multimedia applications continues to be diversified and increasing in scale, the demand for display devices for displaying images has increased and diversified. For example, display devices have been applied to a variety of electronic devices such as a smart phone, a tablet personal computer (PC), a digital camera, a notebook computer, a navigation device, a monitor, a television (TV), and the like. Examples of display devices include flat panel display devices such as a liquid crystal display (LCD) device, a field emission display (FED) device, an organic light-emitting diode (OLED) display device, a quantum dot light-emitting diode (QLED) display device, and the like.

Each display device may be equipped with a display panel for displaying an image and a sound generator capable of generating sound by vibrating the display panel.

SUMMARY

Embodiments of the disclosure include a display device capable of providing stereo sound of multiple channels using multiple sound generators.

Aspects of embodiments of the disclosure include a sound providing method of a display device capable of providing stereo sound of multiple channels using multiple sound generators.

However, embodiments of the disclosure may not be restricted to those set forth herein. The above and other embodiments of the disclosure will become more apparent to one of ordinary skill in the art to which the disclosure pertains by referencing the detailed description of the disclosure herein.

According to an embodiment, a display device may include a display panel including a substrate and a pixel array layer that may be disposed on a first surface of the substrate; a first sound generator that may be disposed on a second surface of the substrate, which may be opposite to the first surface of the substrate, the first sound generator may be configured to vibrate the display panel in accordance with a first sound signal to output first sound; and a second sound generator that may be disposed on the second surface of the substrate, and configured to vibrate the display panel in accordance with a second sound signal to output second sound, wherein the first sound may include both sound in a low-frequency range and sound in a high-frequency range, which may be higher than the low-frequency range, and the second sound may include sound in the high-frequency range.

The display device may include a third sound generator that may be disposed on the second surface of the substrate, and that may be configured to vibrate the display panel in accordance with a third sound signal to output third sound, wherein the third sound may include sound in the high-frequency range.

The low-frequency range may be less than or equal to about 800 Hz, and the high-frequency range may be greater than or equal to about 800 Hz. The display device may include a sound driver that may be configured to generate the first, second, and third sound signals from first and second stereo signals in a first mode, and generate the first, second, and third sound signals from the first stereo signal, the second stereo signal, and a third stereo signal in a second mode.

The sound driver may include a digital signal processor, which in the first mode, may be configured to calculate first and second high-frequency signals by high-pass-filtering the first and second stereo signals, respectively, generate a mixed stereo signal by mixing the first and second stereo signals, and calculate a mixed low-frequency signal from the mixed stereo signal; a digital-to-analog converter, which in the first mode, may be configured to convert the mixed low-frequency signal into a first analog signal, convert the first high-frequency signal into a second analog signal, and convert the second high-frequency signal into a third analog signal; and an amplifier, which in the first mode, may be configured to amplify the first analog signal into the first sound signal and output the first sound signal to the first sound generator, amplify the second analog signal into the second sound signal and output the second sound signal to the second sound generator, and amplify the third analog signal into the third sound signal and output the third sound signal to the third sound generator.

The sound driver may include a digital signal processor, which in the second mode, may be configured to calculate first and second high-frequency signals by high-pass-filtering the first and second stereo signals, respectively, generate a mixed stereo signal by mixing the first and second stereo signals, calculate a mixed low-frequency signal by low-pass-filtering the mixed stereo signal, and generate a modulated stereo signal by mixing the mixed low-frequency signal and the third stereo signal; a digital-to-analog converter, which in the second mode, may be configured to convert the mixed low-frequency signal into a first analog signal, convert the first high-frequency signal into a second analog signal, and convert the second high-frequency signal into a third analog signal; and an amplifier, which in the second mode, may be configured to amplify the first analog signal into the first sound signal and output the first sound signal to the first sound generator, amplify the second analog signal into the second sound signal and output the second sound signal to the second sound generator, and amplify the third analog signal into the third sound signal and output the third sound signal to the third sound generator.

The sound driver may include a digital signal processor, which in the second mode, may be configured to calculate first, second, and third high-frequency signals by high-pass-filtering the first, second, and third stereo signals, respectively, calculate first, second, and third low-frequency signals by low-pass-filtering the first, second, and third stereo signals, respectively, generate a mixed stereo signal by mixing the first and second stereo signals, calculate a mixed low-frequency signal by low-pass-filtering the mixed stereo signal, generate a mixed low-frequency signal by mixing the first, second, and third low-frequency signals, and generate a modulated stereo signal by mixing the third high-frequency signal and the mixed low-frequency signal; a digital-to-analog converter, which in the second mode, may be configured to convert the mixed low-frequency signal into a first analog signal, convert the first high-frequency signal into a second analog signal, and convert the second high-frequency signal into a third analog signal; and an amplifier, which in the second mode, may be configured to amplify the first analog signal into the first sound signal and output the first sound signal to the first sound generator, amplify the second analog signal into the second sound signal and output the second sound signal to the second sound generator, and amplify the third analog signal into the third sound signal and output the third sound signal to the third sound generator.

The display device may include a sound driver configured to generate first, second, and third modulated stereo signals using first and second stereo signals, generate the first, second, and third sound signals from the first and second modulated stereo signals in a first mode, and generate the first, second, and third sound signals from the first, second, and third modulated stereo signals in a second mode.

The first sound generator may include a bobbin disposed on the first surface of the substrate, a voice coil around the bobbin, and a magnet disposed on and spaced apart from the bobbin, and each of the second and third sound generators may include a first electrode to which a first driving voltage may be applied, a second electrode to which a second driving voltage may be applied, and a piezoelectric material that may be configured to contract or expand in accordance with the first or second driving voltage.

The second sound generator may be closer to a first side of the display panel than may be the third sound generator, the third sound generator may be closer to a second side of the display panel, which may be opposite to the first side, than may be the second sound generator, and the first sound generator may be closer to a center of the display panel than may be the second and third sound generators.

According to an embodiment, a display device may include a display panel including a substrate and a pixel array layer that may be disposed on a first surface of the substrate; a first sound generator that may be disposed on a second surface of the substrate, which may be opposite to the first surface of the substrate, the first sound generator may be configured to vibrate the display panel in accordance with a first sound signal to output first sound; a second sound generator that may be disposed on the second surface of the substrate, and configured to vibrate the display panel in accordance with a second sound signal to output second sound; and a fourth sound generator that may be disposed on the second surface of the substrate, and configured to vibrate the display panel in accordance with a fourth sound signal to reinforce the first sound, wherein the first sound may include sound in a low-frequency range, and the second sound may include sound in a high-frequency range, which may be higher than the low-frequency range.

A distance between the first and fourth sound generators may be smaller than a distance between the first and second sound generators, a length, in a first direction, of the fourth sound generator may be smaller than a length, in the first direction, of the third sound generator, and a length, in a second direction, of the fourth sound generator may be smaller than a length, in the second direction, of the second sound generator.

The display device may include a third sound generator that may be disposed on the second surface of the substrate, and configured to vibrate the display panel in accordance with a third sound signal to output third sound, wherein the third sound may include sound in the high-frequency range.

The low-frequency range may be less than or equal to about 800 Hz, and the high-frequency range may be greater than or equal to about 800 Hz.

A distance between the first and fourth sound generators may be smaller than a distance between the first and third sound generators, a length, in a first direction, of the fourth sound generator may be smaller than a length, in the first direction, of the third sound generator, and a length, in a second direction, of the fourth sound generator may be smaller than a length, in the second direction, of the third sound generator.

The display device may include a sound driver that may be configured to generate the first, second, and fourth sound signals from first and second stereo signals in a first mode, and generate the first, second, third, and fourth sound signals from the first stereo signal, the second stereo signal, and a third stereo signal in a second mode.

The sound driver may include a digital signal processor, which in the second mode, may be configured to calculate first, second, and third high-frequency signals from the first, second, and third stereo signals, respectively, generate a mixed stereo signal by mixing the first, second, and third stereo signals, and calculate a mixed low-frequency signal by low-pass-filtering the mixed stereo signal; a digital-to-analog converter, which in the second mode, may be configured to convert the mixed low-frequency signal into a first analog signal, convert the first high-frequency signal into a second analog signal, convert the second high-frequency signal into a third analog signal, and convert the third high-frequency signal into a fourth analog signal; and an amplifier, which in the second mode, may be configured to amplify the first analog signal into the first sound signal and output the first sound signal to the first sound generator, amplify the second analog signal into the second sound signal and output the second sound signal to the second sound generator, amplify the third analog signal into the third sound signal and output the third sound signal to the third sound generator, and amplify the fourth analog signal into the fourth sound signal and output the fourth sound signal to the fourth sound generator.

The first sound generator may include a bobbin disposed on the first surface of the substrate, a voice coil disposed around the bobbin, and a magnet disposed on and spaced apart from the bobbin, and each of the second and third sound generators may include a first electrode to which a first driving voltage may be applied, a second electrode to which a second driving voltage may be applied, and a piezoelectric material that may be configured to contract or expand in accordance with the first or second driving voltage.

The bobbin of the first sound generator may be disposed around the fourth sound generator.

The bobbin of the first sound generator may be disposed on a first surface of the fourth sound generator.

According to an embodiment, a sound providing method may include calculating a first high-frequency signal, a second high-frequency signal, and a mixed low-frequency signal from first stereo sound and second stereo sound in a first mode; and in the first mode, converting the mixed low-frequency signal into a first sound signal and outputting the first sound signal to a first sound generator, converting the first high-frequency signal into a second sound signal and outputting the second sound signal to a second sound generator, and converting the second high-frequency signal into a third sound signal and outputting the third sound signal to a third sound generator.

The sound providing method may include, in a second mode, calculating the first high-frequency signal, the second high-frequency signal, and a modulated stereo signal from the first stereo signal, the second stereo signal, and a third stereo signal; and in the second mode, converting the modulated stereo signal into the first sound signal and outputting the first sound signal to the first sound generator, converting the first high-frequency signal into the second sound signal and outputting the second sound signal to the second sound generator, and converting the second high-frequency signal into the third sound signal and outputting the third sound signal to the third sound generator.

According to the embodiments of the disclosure, the modulated stereo signal, which may include not only the central stereo sound in each of the high-frequency range and the low-frequency range, but also the right stereo sound in the low-frequency range and the left stereo sound in the low-frequency range, may be converted into a first sound signal, which may be an analog signal, and the first sound signal may be output to the first sound generator. The first high-frequency signal, which may include the right stereo sound in the high-frequency range, may be converted into a second sound signal, which may be an analog signal. The second sound signal may be output to the second sound generator. The second high-frequency signal, which may include the left stereo sound in the high-frequency range, may be converted into the third sound signal, which may be an analog signal. The third sound signal may be output to the third sound generator. Accordingly, since the left stereo sound in each of the high-frequency range and the low-frequency range, the right stereo sound in each of the high-frequency range and the low-frequency range, and the central stereo sound in each of the high-frequency range and the low-frequency range may all be output, high-quality stereo sound may be provided.

In the first mode, the first sound, which may be output by the vibration of the display panel by the first sound generator, may include sound in the low-frequency range, and thus, 2.1 channels of stereo sound may be provided. In the second mode, the first sound may include both sound in the low-frequency range and sound in the high-frequency range, and thus, 3.1 channels of stereo sound may be provided simply by using only three sound generators.

Moreover, since in the second mode, first sound in the high-frequency range may be reinforced using the fourth sound generator, 3.1 channels of stereo sound may be provided.

Other features and embodiments may be apparent from the following detailed description, the drawings, and the claims.

BRIEF DESCRIPTION OF THE DRAWINGS

The above and other embodiments and aspects of the disclosure will become more apparent by describing in more detail embodiments thereof with reference to the attached drawings, in which.

DETAILED DESCRIPTION OF THE EMBODIMENTS

Figure 1:
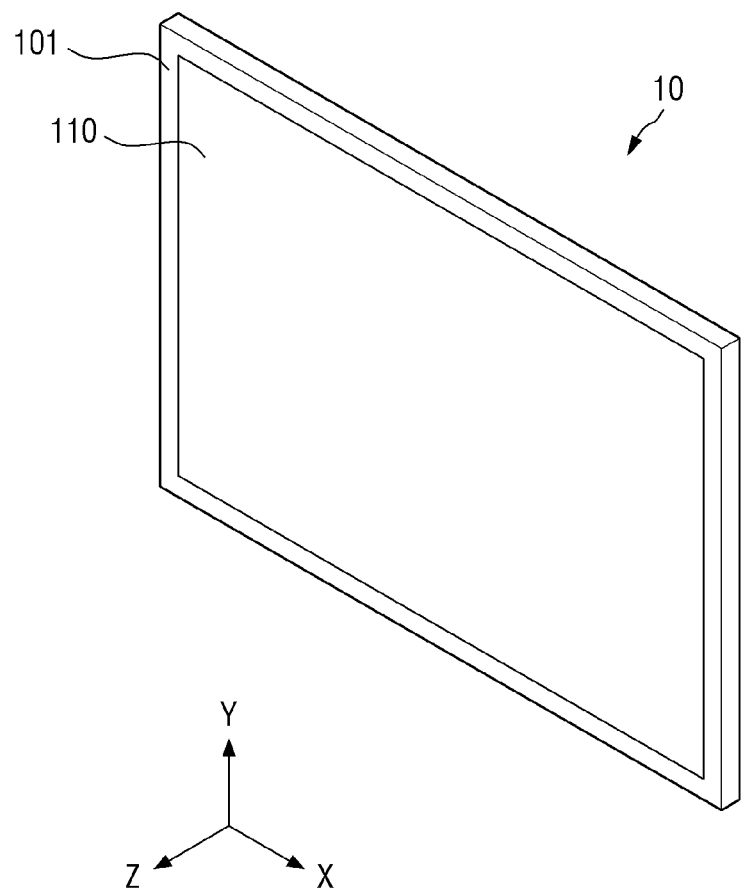
FIG. 1 shows a perspective view of a display device according to an embodiment of the disclosure.

Aspects of embodiments of the invention follow more fully hereinafter with reference to the accompanying drawings. Embodiments may be embodied in different forms and should not be construed as limited to the shown and described embodiments set forth herein. Rather, these embodiments may be provided so that this disclosure will be thorough and complete, and will fully convey the scope of the disclosure to those skilled in the art.

To clearly describe the embodiments, parts that are irrelevant to the description are omitted, and like numerals refer to like or similar constituent elements throughout the disclosure.

Further, since sizes and thicknesses of constituent members shown in the accompanying drawings may be arbitrarily given for better understanding and ease of description, the embodiments may not be limited to the illustrated sizes and thicknesses. In the figures, the thicknesses of layers, films, panels, regions, etc., may be exaggerated for clarity. In the figures, for better understanding and ease of description, the thicknesses of some layers and areas may be exaggerated.

It will be understood that when an element such as a layer, film, region, or substrate may be referred to as being "on" another element, it may be directly on the other element or intervening elements may also be present. In contrast, when an element is referred to as being "directly on" another element, there may be no intervening elements present. The word "over" or "on" means positioning on or below an object portion, and does not necessarily mean positioning on the upper side of the object portion based on a gravity direction.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items. Expressions such as "at least one of," when preceding a list of elements, modify the entire list of elements and do not modify the individual elements of the list.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

Figure 2:
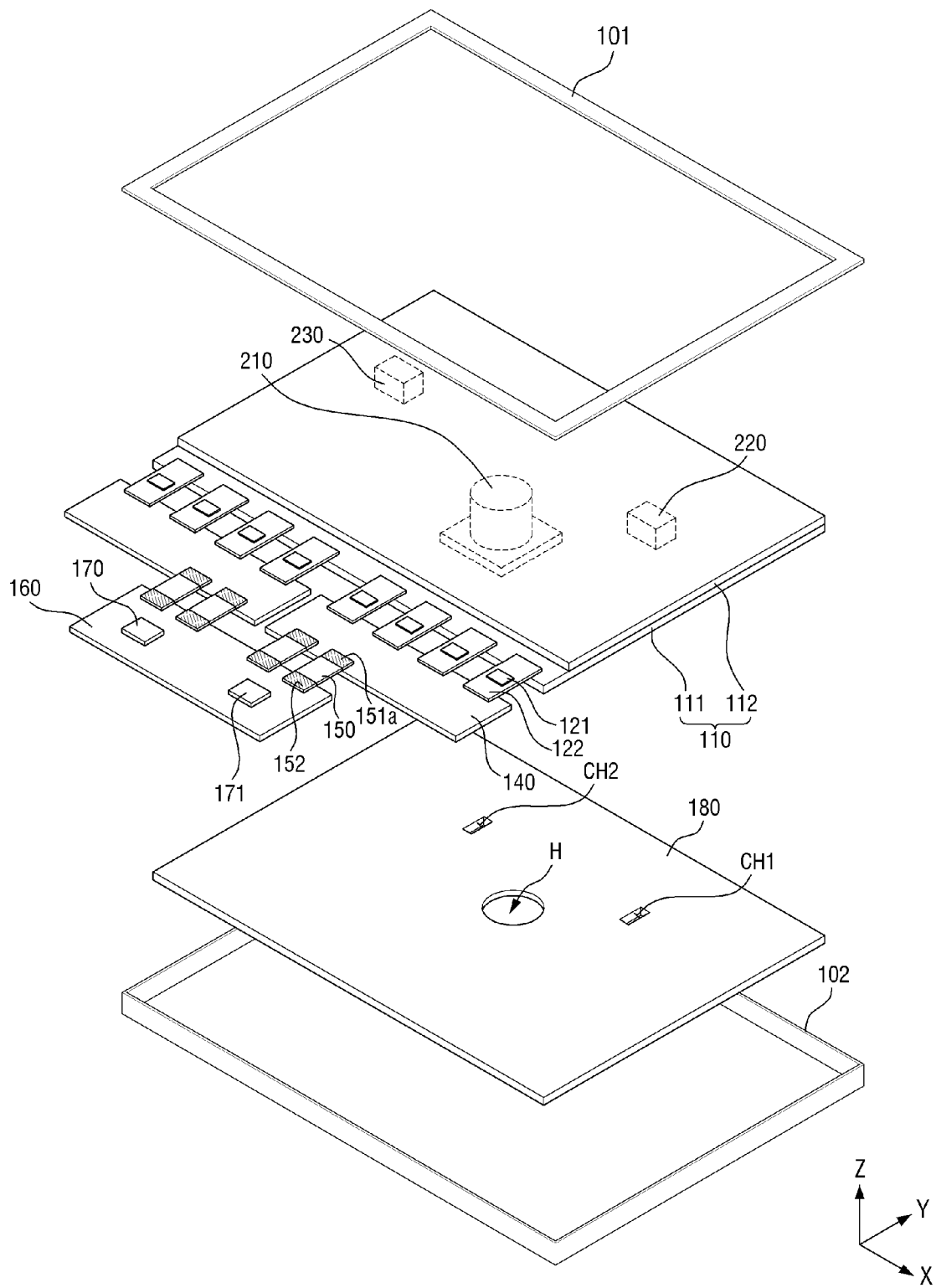
FIG. 2 shows an exploded perspective view of the display device of FIG. 1.

FIG. 1 shows a perspective view of a display device according to an embodiment of the disclosure. FIG. 2 shows an exploded perspective view of the display device of FIG. 1.

Referring to FIGS. 1 and 2, a display device 10 may include an upper set cover 101, a lower set cover 102, a display panel 110, source driving circuits 121, flexible films 122, a heat dissipation film 130, source circuit boards 140, first cables 150, a control circuit board 160, a timing control circuit 170, a lower cover 180, a first sound generator 210, a second sound generator 220, and a third sound generator 230.

The terms "above", "top", and "top surface", as used herein, denote a direction in which a second substrate 112 of the display panel 110 may be disposed with respect to a first substrate 111 of the display panel 110, i.e., a Z-axis direction, and the terms "below", "bottom", and "bottom surface", as used herein, denote a direction in which the heat dissipation film 130 may be disposed with respect to the first substrate 111 of the display panel 110, i.e., the opposite direction of the Z-axis direction. Also, the terms "left", "right", "upper", and "lower", as used herein, denote their respective directions as viewed from above the display panel 110. For example, the term "left" denotes an X-axis direction, the term "right" denotes the opposite direction of the X-axis direction, the term "upper" denotes a Y-axis direction, and the term "lower" denotes the opposite direction of the Y-axis direction.

The upper and lower set covers 101 and 102 may be disposed to surround or be around the edges of the display panel 110. The upper and lower set covers 101 and 102 may cover a non-display area. The upper set cover 101 may cover the edges of the top surface of the display panel 110, and the lower set cover 102 may cover the sides of the display panel 110 and the bottom of the lower cover 180. The upper and lower set covers 101 and 102 may be coupled to each other via fixing members such as screws and/or an adhesive member such as a double-sided tape or an adhesive. The upper and lower set covers 101 and 102 may be formed of plastic or a metal or may include both plastic and a metal.

The display panel 110 may have a rectangular shape in a plan view. For example, as illustrated in FIG. 2, the display panel 110 may be in the shape of a rectangle having a pair of long sides extending in a first direction (or an X-axis direction) and a pair of short sides extending in a second direction (or a Y-axis direction). The corners at which the long sides and the short sides meet may be right-angled or may be rounded to have a predetermined curvature. The planar shape of the display panel 110 may not be limited to a rectangular shape, i.e., the display panel 110 may be formed into various other shapes such as another polygonal shape, a circular shape, or an elliptical shape.

FIG. 2 illustrates that the display panel 110 may be flat. The display panel 110 may be bent to have a predetermined curvature.

The display panel 110 may include first and second substrates 111 and 112. The second substrate 112 may be disposed to face a first surface of the first substrate 111. The first and second substrates 111 and 112 may be formed to be rigid or flexible. The first substrate 111 may be formed of glass or plastic. The second substrate 112 may be formed as a glass substrate, a plastic substrate, an encapsulation film, or a barrier film. The plastic substrate may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The encapsulation film or the barrier film may be a film in which inorganic films are stacked.

The display panel 110 may be an organic light-emitting diode (OLED) display panel using OLEDs each having a first electrode, an organic light-emitting layer, and a second electrode, an inorganic light-emitting diode (LED) display panel using inorganic LEDs each having a first electrode, an inorganic semiconductor layer, and a second electrode, or a quantum-dot light-emitting diode (QLED) display panel using QLEDs each having a first electrode, a quantum-dot light-emitting layer, and a second electrode. The display panel 110 will hereinafter be described as being an OLED display panel having a thin-film transistor (TFT) layer TFTL which may be disposed between the first and second substrates 111 and 112, a light-emitting element layer EML, a filler member FL, a wavelength conversion layer QDL, and a color filter layer CFL. The first substrate 111 may be a TFT substrate where the TFT layer TFTL, the light-emitting element layer EML, and an encapsulation film 345 may be formed. The second substrate 112 may be a color filter substrate where the wavelength conversion layer QDL and the color filter layer CFL may be formed. The filler member FL may be disposed between the thin-film encapsulation layer TFEL 345 of the first substrate 111 and the wavelength conversion layer QDL of the second substrate 112. A discussion of the TFT layer TFTL, the light-emitting element layer EML, the filler member FL, the wavelength conversion layer QDL, and the color filter layer CFL of the display panel 110 follows below with reference to FIG. 6.

The second substrate 112 of the display panel 110 may not be provided, and the thin-film encapsulation layer TFEL 345 may be disposed on the light-emitting element layer EML. The filler member FL may not be provided, and the wavelength conversion layer QDL and the color filter layer CFL may be disposed on the thin-film encapsulation layer TFEL 345.

First sides of the flexible films 122 may be disposed on the first surface of the first substrate 111 of the display panel 110, and second sides of the flexible films 122 may be attached to first surfaces of the source circuit boards 140. Since the first substrate 111 may be larger than the second substrate 112, a side of the first substrate 111 may not be covered, but exposed by the second substrate 112, and the flexible films 122 may be attached to the exposed side of the first substrate 111. The flexible films 122 may be attached to the first surface of the first substrate 111 and the first surfaces of the source circuit boards 140 via anisotropic conductive films.

Figure 3:
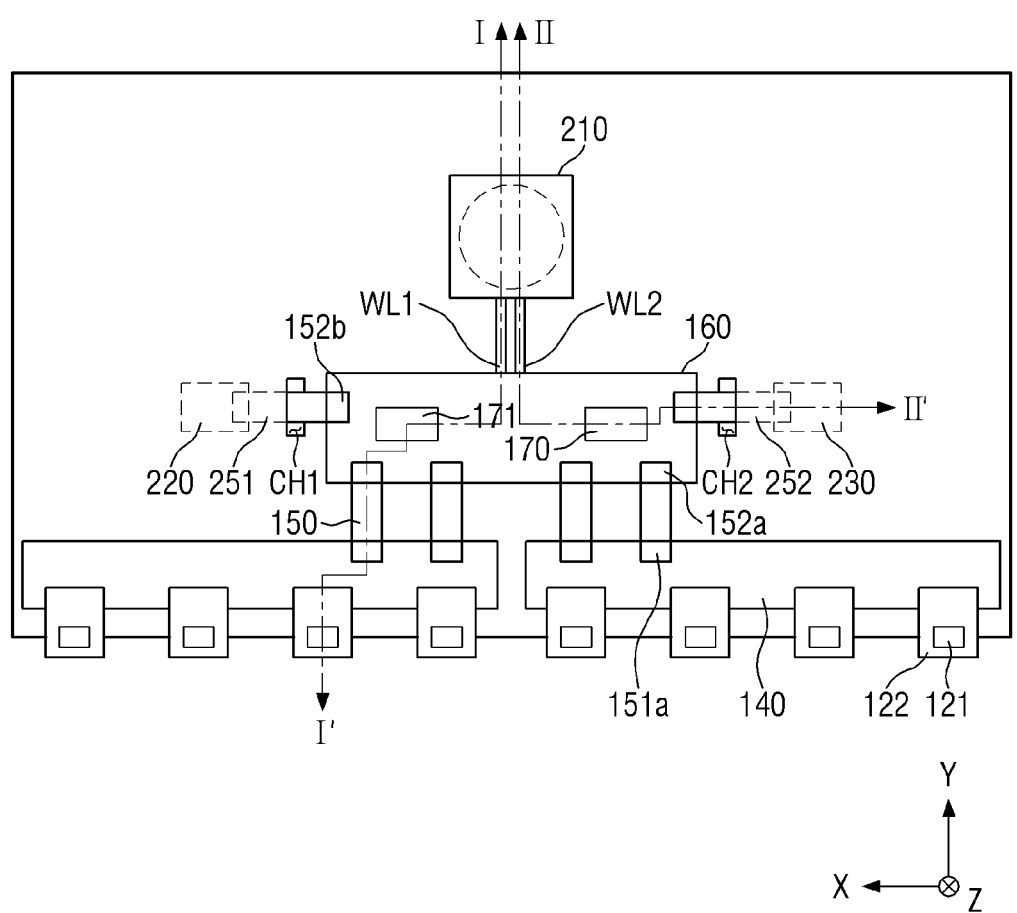
FIG. 3 shows a bottom view of the display device of FIG. 2.
Figure 4:
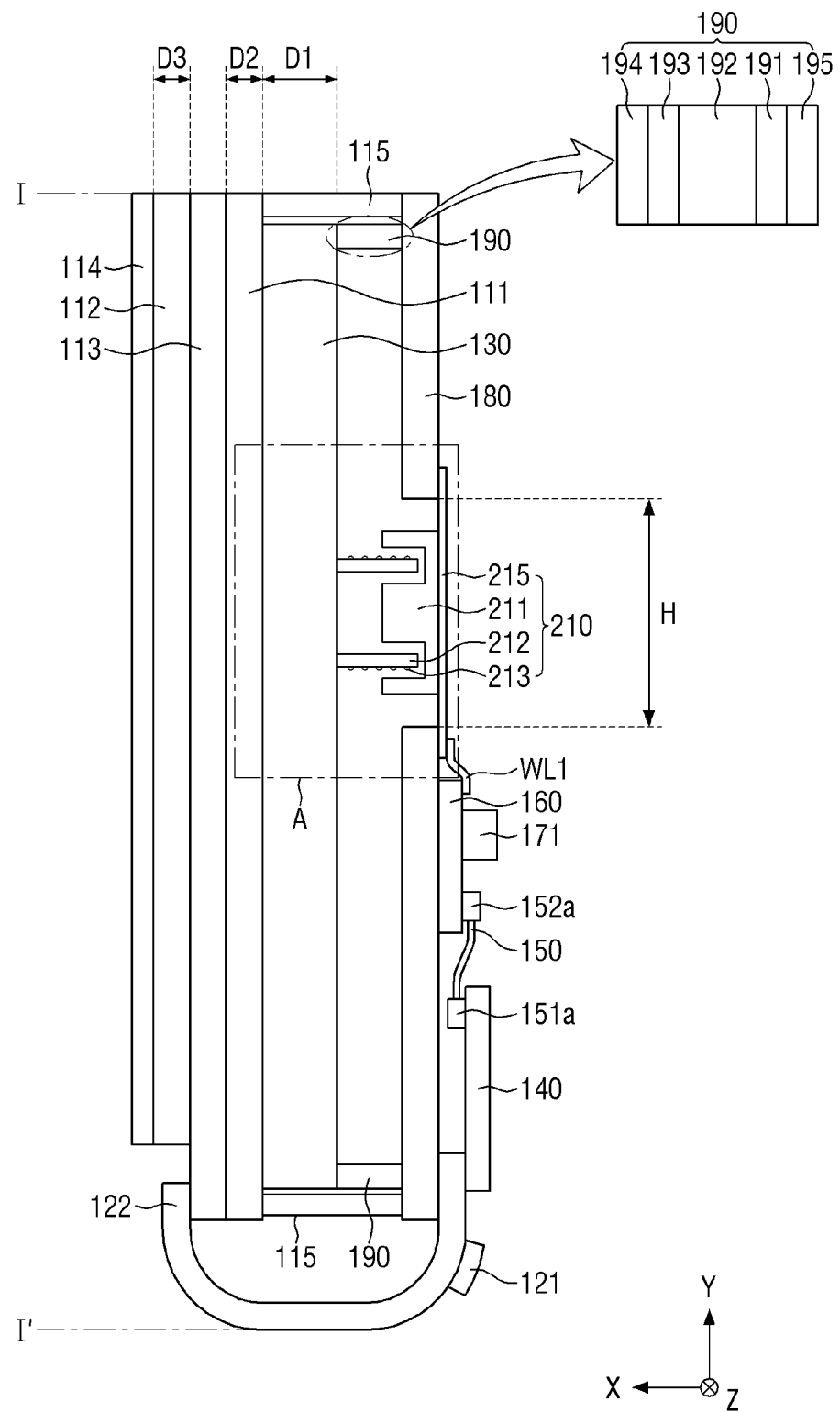
FIG. 4 shows a schematic cross-sectional view taken along line I-I' of FIG. 3.

The flexible films 122 may be tape carrier packages or chip-on-films (COFs). The flexible films 122 may be bendable. The flexible films 122 may be bent toward the bottom of the first substrate 111, as illustrated in FIGS. 3 and 4. The source circuit boards 140, the first cables 150, and the control circuit board 160 may be disposed at the bottom of the lower cover 180.

FIG. 2 illustrates that eight flexible films 122 may be attached to the first substrate 111 of the display panel 110, but other arrangement of the flexible films 122 may be provided.

The source driving circuits 121 may be disposed on first surfaces of the flexible films 122. The source driving circuits 121 may be formed as integrated circuits (ICs). The source driving circuits 121 may convert digital video data into analog data voltages in accordance with source control signals and may provide the analog data voltages to the data lines of the display panel 110 via the flexible films 122.

The source circuit boards 140 may be connected to the control circuit board 160 via the first cables 150. The source circuit boards 140 may include first connectors 151 to be connected to the first cables 150. The source circuit boards 140 may be printed circuit boards (PCBs) or flexible PCBs (FPCBs). The first cables 150 may be flexible cables.

The control circuit board 160 may be connected to the source circuit boards 140 via the first cables 150. The control circuit board 160 may include second connectors 152 to be connected to the first cables 150. The control circuit board 160 may be fixed to a first surface of the lower cover 180 via fixing members such as screws. The control circuit board 160 may be a PCB or an FPCB.

FIG. 2 illustrates that four first cables 150 may be provided to connect the source circuit boards 140 and the control circuit board 160, but another arrangement of first cables 150 may be provided. Also, FIG. 2 illustrates that there may be provided two source circuit boards 140, but another arrangement of source circuit boards 140 may be provided.

If there are only a small number of flexible films 122, the source circuit boards 140 may not be provided. Accordingly, the flexible films 122 may be directly connected to the control circuit board 160.

The timing control circuit 170 may be disposed on a first surface of the control circuit board 160. The timing control circuit 170 may be formed as an integrated circuit (IC). The timing control circuit 170 may receive digital video data and timing signals from a system-on-chip (SOC) of the system circuit board and may generate source control signals for controlling the timings of the source driving circuits 1221 in accordance with the timing signals.

A sound driver 171 may be disposed on the first surface of the control circuit board 160. The sound driver 171 may be formed as an IC. The sound driver 171 may receive stereo signals from the system circuit board. The sound driver 171 may convert the stereo signals, which are digital signals, into first, second, and third sound signals, which are analog signals. The sound driver 171 may output the first, second, and third sound signals to the first, second, and third sound generators 210, 220, and 230, respectively.

The SOC may be mounted on the system circuit board, which may be connected to the control circuit board 160 via flexible cables, and may be formed as an IC. The SOC may be a processor of a smart television (TV), a central processing unit (CPU) or a graphic card of a computer or a laptop computer, or an application processor of a smartphone or a tablet personal computer (PC). The system circuit board may be a PCB or an FPCB.

A power supply circuit may be attached to the first surface of the control circuit board 160. The power supply circuit may generate voltages necessary for driving the display panel 110 from main power applied thereto from the system circuit board and may provide the generated voltages to the display panel 110. For example, the power supply circuit may generate a high-potential voltage, a low-potential voltage, and an initialization voltage for driving the OLEDs and may provide the generated voltages to the display panel 110. The power supply circuit may generate and provide driving voltages for driving the source driving circuits 121 and the timing control circuit 170. The power supply circuit may be formed as an IC. The power supply circuit may be disposed on a power supply circuit board, which may be formed separately from the control circuit board 160. The power supply circuit board may be a PCB or an FPCB.

The first, second, and third sound generators 210, 220, and 230 may be disposed on a second surface of the first substrate 111 disposed opposite to the first surface of the first substrate 111. The first sound generator 210 may be a vibration device capable of vibrating the display panel 110 in a third direction (or the Z-axis direction) in accordance with the first sound signal. The second sound generator 220 may be a vibration device capable of vibrating the display panel 110 in the third direction in accordance with the second sound signal. The third sound generator 230 may be a vibration device capable of vibrating the display panel 110 in a third direction in accordance with the third sound signal.

Figure 7:
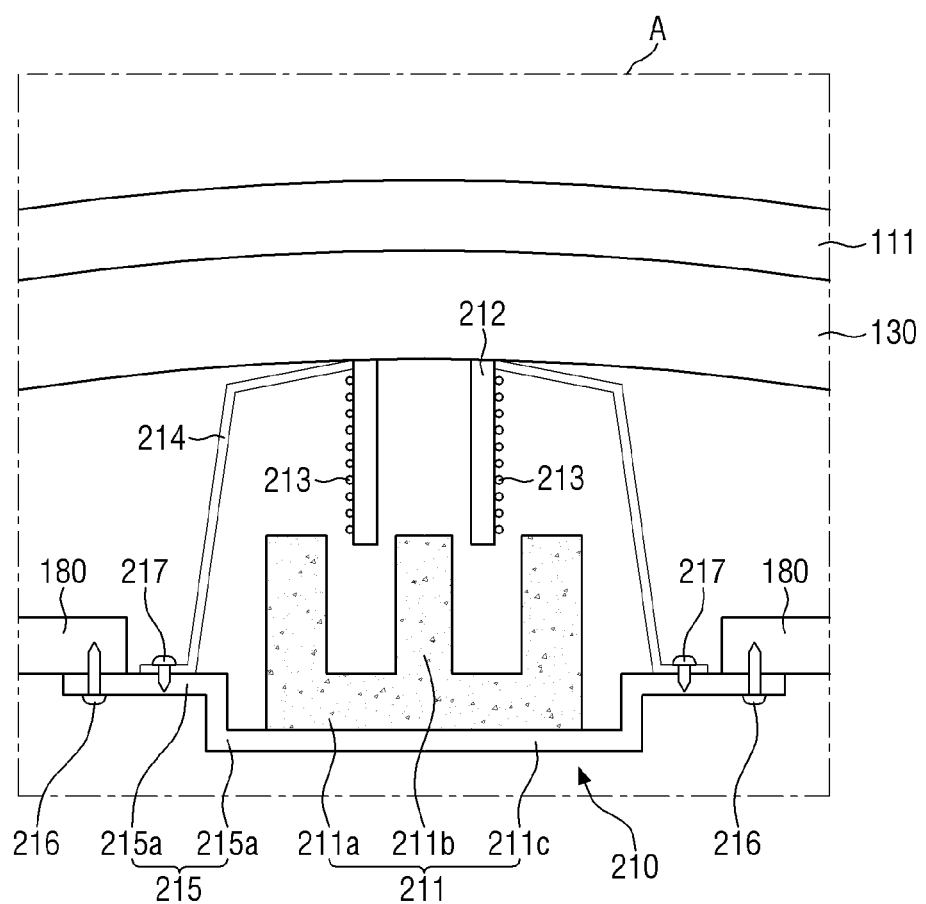
FIGS. 7 and 8 illustrate how the display panel of FIG. 2 may be vibrated by a first sound generator of FIG. 2.
Figure 8:
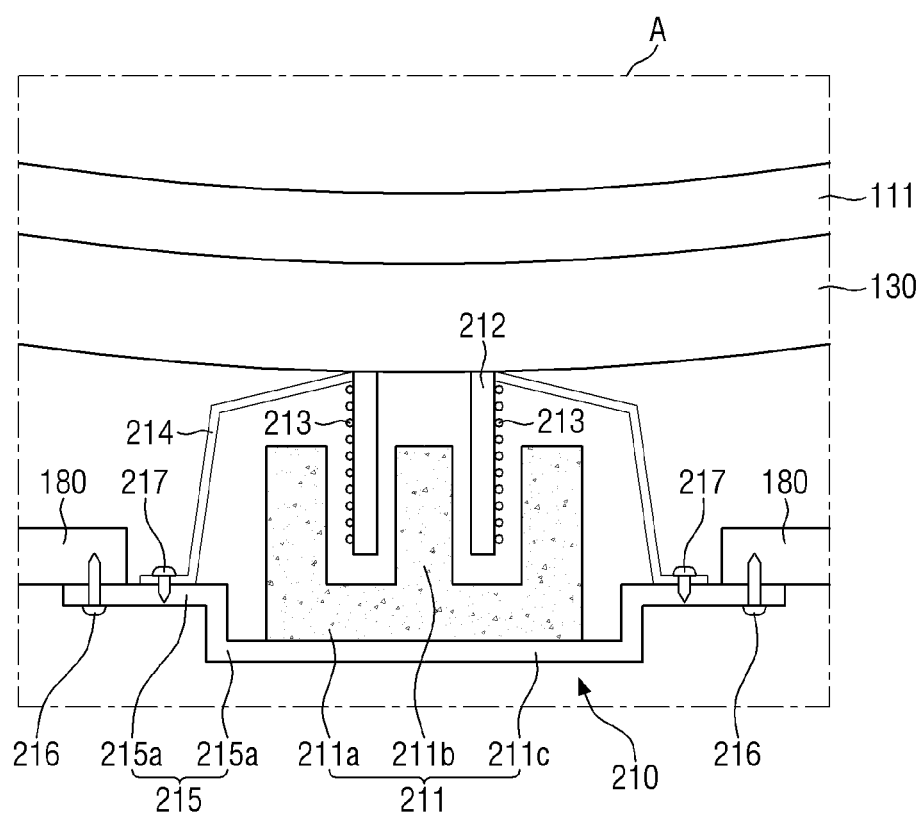

The first sound generator 210 may be an exciter capable of vibrating the display panel 110 by generating a magnetic force using a voice coil, as illustrated in FIGS. 7 and 8. The second and third sound generators 220 and 230 may be piezoelectric elements or piezoelectric actuators capable of vibrating the display panel 110 using a piezoelectric material that may contract or expand in accordance with a voltage applied thereto, as illustrated in FIGS. 9 through 12.

The first sound generator 210 may serve as a high-pitched and low-pitched sound generator for outputting first sound in each of a low-frequency range and a high-frequency range. The second sound generator 220 may serve as a high-pitched sound generator for outputting second sound in the high-frequency range. The third sound generator 230 may serve as a high-pitched sound generator for outputting third sound in the high-frequency range. Since the display device 10 may output 2.1 or 3.1 channels of stereo sound, the display device 10 may provide high-quality sound to a user.

Sound in the low-frequency range may refer to sound having a low frequency of less than or equal to about 800 Hz, and sound in the high-frequency range may refer to sound having a high frequency of greater than or equal to about 800 Hz. In a case where sound in the low-frequency range may be sound having a low frequency of less than or equal to about 800 Hz, sound in the low-frequency range may include both low-pitched sound and middle-pitched sound.

The lower cover 180 may be disposed on the second surface of the first substrate 111. A hole H in which the first sound generator 210 may be disposed may be formed in part of the lower cover 180 corresponding to the first sound generator 210. The lower cover 180 may include a metal or tempered glass.

As described above, the display device 10 may output sound in a forward direction by using the first, second, and third sound generators 210, 220, and 230 and using the display panel 110 as a diaphragm. Thus, the quality of sound that may be output may be improved. A separate speaker may not be provided at the bottom or on one side of the display panel 110 due to the presence of the first, second, and third sound generators 210, 220, and 230.

FIGS. 1 and 2 illustrate that the display device 10 is a mid-size or large-size display device including multiple source driving circuits 121, but the disclosure may not be limited thereto. As another example, the display device 10 may be a small-size display device including only one source driving circuit 121, wherein the flexible films 122 and the cables 150 may not be provided. The source driving circuits 121 and the timing control circuit 170 may be incorporated into a single IC and may be attached to a single FPCB or to the first substrate 111 of the display panel 110. Examples of a mid-size or large-size display device may include a monitor, a TV, and the like, and examples of a small-size display device may include a smartphone, a tablet PC, and the like.

Figure 5:
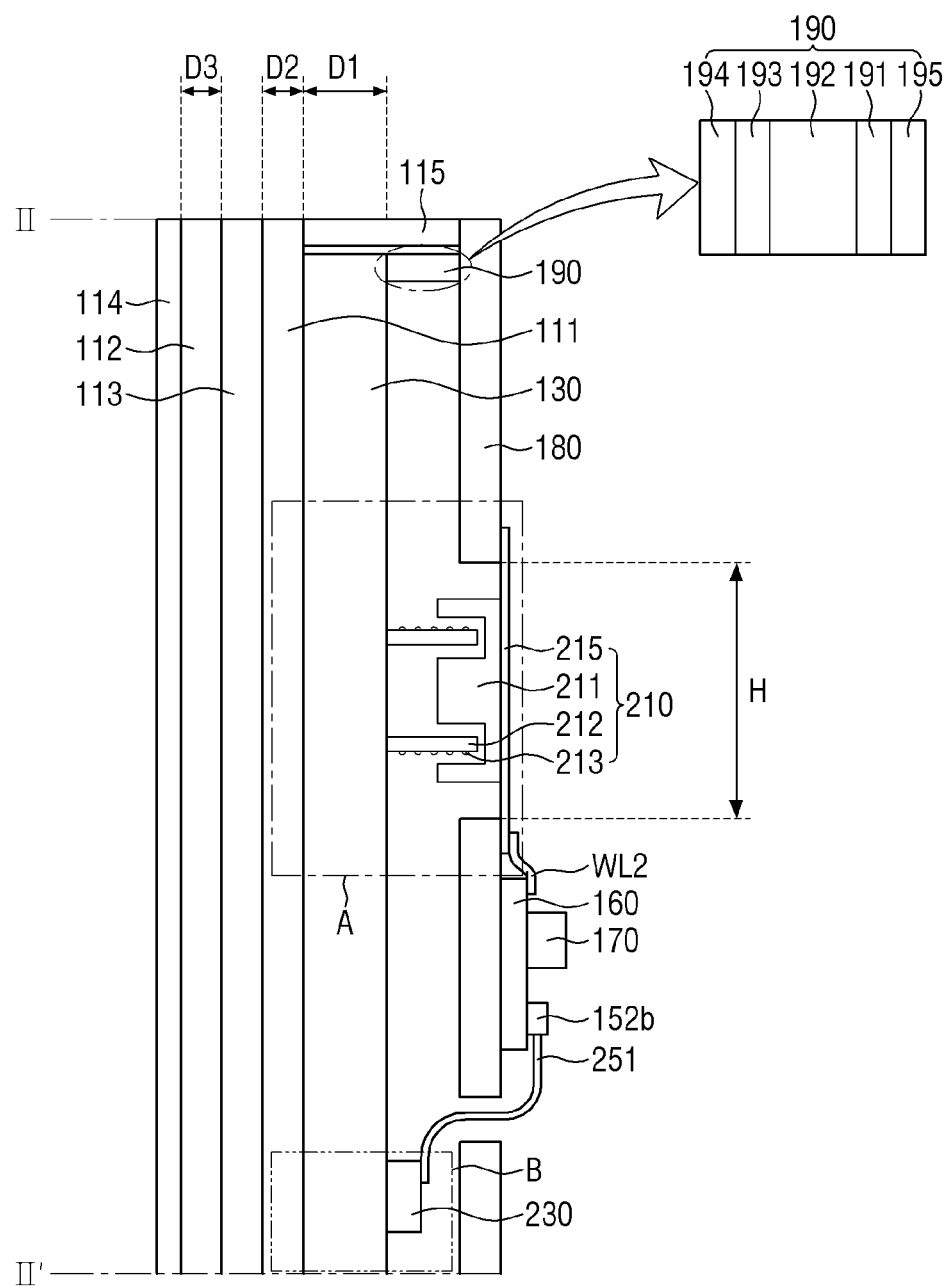
FIG. 5 shows a schematic cross-sectional view taken along line II-II' of FIG. 3.

FIG. 3 shows a bottom view of an example of the display device of FIG. 2. FIG. 4 shows a schematic cross-sectional view taken along line I-I' of FIG. 3. FIG. 5 shows a schematic cross-sectional view taken along line II-II' of FIG. 3.

Figure 6:
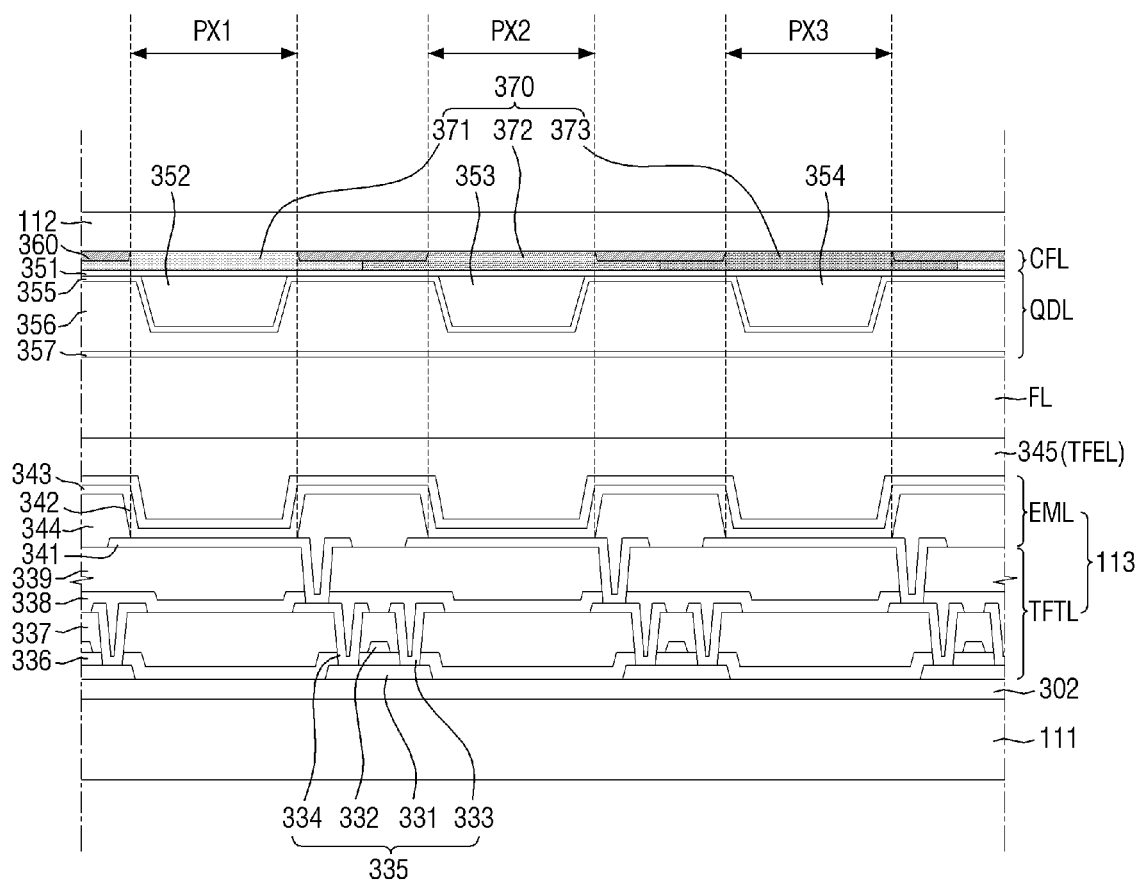
FIG. 6 shows a schematic cross-sectional view illustrating a first substrate, a second substrate, and a pixel array layer of a display panel of FIG. 2.

Referring to FIGS. 3 through 5, the first surface of the first substrate 111 and a first surface of the second substrate 112 may face each other. A pixel array layer 113 may be disposed between the first surfaces of the first and second substrates 111 and 112. As illustrated in FIG. 6, the pixel array layer 113 may include subpixels (PX1, PX2, and PX3) which emit light.

The heat dissipation film 130 may be disposed on the second surface of the first substrate 111. The first sound generator 210 may be disposed on a first surface of the heat dissipation film 130. The heat dissipation film 130 may release heat generated by the first sound generator 210. The heat dissipation film 130 may include a graphite layer or a metal layer having high thermal conductivity such as a silver (Ag) layer, a copper (Cu) layer, or an aluminum (Al) layer.

The heat dissipation film 130 may include graphite or metal layers which may be formed in the first direction (or the X-axis direction) and the second direction (or the Y-axis direction), rather than in the third direction (or the Z-axis direction). For example, heat generated by the first sound generator 210 may be diffused in the first direction (or the X-axis direction) and the second direction (or the Y-axis direction) and may thus be effectively released. As a result, an influence of the heat on the display panel 110 that may be generated by the first sound generator 210 may be minimized by the heat dissipation film 130. In order to prevent the heat generated by the first sound generator 210 from affecting the display panel 110, a thickness D1 of the heat dissipation film 130 may be greater than a thickness D2 of the first substrate 111 and a thickness D3 of the second substrate 112. The first direction (or the X-axis direction) may be the width direction of the display panel 110, the second direction (or the Y-axis direction) may be the height direction of the display panel 110, and the third direction (or the Z-axis direction) may be the thickness direction of the display panel 110.

The size of the heat dissipation film 130 may be smaller than the size of the first substrate 111, and thus, the edges on the first surface of the first substrate 111 may not be covered, but may be exposed, by the heat dissipation film 130.

The heat dissipation film 130 may not be provided. Accordingly, elements disposed on the first surface of the heat dissipation film 130 may be disposed on the first surface of the first substrate 111.

The flexible films 122 may be bent toward the bottom of the lower cover 180 and may be attached to the source circuit boards 140 over the first surface of the lower cover 180. The source circuit boards 140 and the control circuit board 160 may be disposed on the first surface of the lower cover 180 and may be connected via the first cables 150.

The first sound generator 210 may be disposed closer to the center of the display panel 110 than the second and third sound generators 220 and 230. The second sound generator 220 may be disposed closer to one side of the display panel 110, for example, the right side of the display panel 110 than the third sound generator 230. The third sound generator 230 may be disposed closer to the other side of the display panel 110, for example, the left side of the display panel 110 than the second sound generator 220.

As illustrated in FIGS. 7 and 8, the first sound generator 210 may include a magnet 211, a bobbin 212, a voice coil 213, and a plate 215. The bobbin 212 may be attached to the first surface of the heat dissipation film 130 via an adhesive member. The adhesive member may be a double-sided adhesive or a double-sided tape. The voice coil 213 may be wound around the outer circumferential surface of the bobbin 212. The bobbin 212 may be formed in a cylindrical shape, the central protruding part of the magnet 211 may be disposed on the inside of the bobbin 212, and a sidewall part of the magnet 211 may be disposed on the outside of the bobbin 212. For example, the magnet 211 may be disposed on and spaced apart from the bobbin 212. The plate 215 may be disposed at the bottom of the magnet 211. The plate 215 may be fixed to the first surface of the control circuit board 160 via the first fixing members 216, such as screws.

The magnet 211 and the bobbin 212 may be disposed in the hole H of the lower cover 180, and the plate 215 may be disposed on the first surface of the control circuit board 160, though not in the hole H of the lower cover 180. The size of the hole H may be smaller than the size of the plate 215.

FIGS. 3 through 5 illustrate that the magnet 211 and the bobbin 212 may have a circular shape in a plan view, the plate 215 has a rectangular shape in a plan view, and the hole H has a circular shape in a plan view. However, the shapes of the plate 215, the bobbin 212, and the hole H may not be limited thereto. As another example, the bobbin 212 and the hole H may have an elliptical shape or a polygonal shape in a cross-sectional view, and the plate 215 may have a circular shape, an elliptical shape, or a polygonal shape in a cross-sectional view.

The bobbin 212 of the first sound generator 210 may be fixed to the first surface of the heat dissipation film 130, and the magnet 211 may be fixed to the lower cover 180. Accordingly, the bobbin 212 having the voice coil 213 wound therearound may reciprocate in the third direction (or the Z-axis direction) in accordance with an applied magnetic force generated around the voice coil 213, and as a result, the display panel 110 may vibrate. A discussion of the first sound generator 210 follows below with reference to FIGS. 7 and 8.

The second and third sound generators 220 and 230 may be attached to the first surface of the heat dissipation film 130 via adhesive members such as pressure sensitive adhesives (PSAs). The second sound generator 220 may be electrically connected to the control circuit board 160 by the first sound circuit board 251, and the third sound generator 230 may be electrically connected to the control circuit board 160 by the second sound circuit board 252. The first and second sound circuit boards 251 and 252 may both be FPCBs or flexible cables.

First and second pads may be formed on a first side of the first sound circuit board 251, and first and second pads may be formed on a first side of the second sound circuit board 252. The first pad of the first sound circuit board 251 may be electrically connected to a first electrode of the second sound generator 220, and the second pad of the first sound circuit board 251 may be connected to a second electrode of the second sound generator 220. The first pad of the second sound circuit board 252 may be connected to a first electrode of the third sound generator 230, and the second pad of the second sound circuit board 252 may be connected to a second electrode of the third sound generator 230.

Connectors may be formed on second sides of the first and second sound circuit boards 251 and 252 to be connected to "2B" connectors 152b of the control circuit board 160. The second sound generator 220 may be connected to one of the "2B" connectors 152b of the control circuit board 160 by the connector of the first sound circuit board 251. The third sound generator 230 may be connected to the other "2B" connector 152b of the control circuit board 160 by the connector of the second sound circuit board 252.

The timing control circuit 170 and the sound driver 171 may be disposed on the control circuit board 160. As another example, the sound driver 171 may be disposed on a circuit board other than the control circuit board 160. For example, the sound driver 171 may be disposed on the system circuit board, the power supply circuit board, or a sound circuit board. The sound circuit board may refer to a circuit board where only the sound driver 171 may be disposed without accompanying another IC.

The sound driver 171 may include a digital signal processor (DSP) which may digitally process sound signals, a digital-to-analog converter (DAC) which may convert digital signals provided by the DSP into analog driving voltages, and an amplifier (AMP) which may amplify and output the analog driving voltages provided by the DAC.

The sound driver 171 may generate a first sound signal including "1A" and "1B" driving voltages for driving the first sound generator 210 in accordance with stereo signals. The sound driver 171 may generate a second sound signal including "2A" and "2B" driving voltages for driving the second sound generator 220 in accordance with stereo signals. The sound driver 171 may generate a third sound signal including "3A" and "3B" driving voltages for driving the third sound generator 230 in accordance with stereo signals. A description of how the sound driver 171 generates the first, second, and third sound signals follows below with reference to FIGS. 13 through 16, 24, and 25.

The first sound generator 210 may receive the first sound signal including the "1A" and "1B" driving voltages from the sound driver 171. The first sound generator 210 may output sound by vibrating the display panel 110 in accordance with the "1A" and "1B" driving voltages. In a case where the plate 215 of the first sound generator 210 may be disposed on the lower cover 180, both ends of the voice coil 213 of the first sound generator 210 may be connected to the first and second sound wires WL1 and WL2. The first and second sound wires WL1 and WL2 may be electrically connected to the metal lines of the control circuit board 160.

The second sound generator 220 may receive the second sound signal including the "2A" and "2B" driving voltages from the sound driver 171. The second sound generator 220 may output sound by vibrating the display panel 110 in accordance with the "2A" and "2B" driving voltages. The second sound signal may be transmitted to the second sound generator 220 via the first sound circuit board 251.

The third sound generator 230 may receive the second sound signal including the "3A" and "3B" driving voltages from the sound driver 171. The third sound generator 230 may output sound by vibrating the display panel 110 in accordance with the "3A" and "3B" driving voltages. The third sound signal may be transmitted to the third sound generator 230 via the second sound circuit board 252.

The second and third sound generators 220 and 230 may be disposed on the heat dissipation film 130. The first sound circuit board 251, which may be connected to the second sound generator 220, may be connected to one of the "2B" connectors 152b of the control circuit board 160 through a first cable hole CH1 which may penetrate the lower cover 180. The second sound circuit board 252, which may be connected to the third sound generator 230, may be connected to the other "2B" connector 152b of the control circuit board 160 through a second cable hole CH2 which may penetrate the lower cover 180. In a plan view, the first cable hole CH1 may be disposed between one side of the control circuit board 160 and the second sound generator 220, and the second cable hole CH2 may be disposed between the other side of the control circuit board 160 and the third sound generator 230.

The size of the heat dissipation film 130 may be smaller than the size of the first substrate 111, as illustrated in FIG. 5, and the four edges on the first surface of the first substrate 111 may not be covered, but may be exposed, by the heat dissipation film 130. A first adhesive member 115 may be disposed on the four edges on the first surface of the first substrate 111 and not covered by the heat dissipation film 130, but exposed, by the heat dissipation film 130. The first adhesive member 115 may bond the first substrate 111 and a second surface of the lower cover 180, as illustrated in FIG. 5. The first adhesive member 115 may be a double-sided tape including a buffer layer such as a foam layer.

A blocking member 190 may be attached to one surface of the heat radiation film 130 and the other surface of the lower cover 180. As another example, in a case where the heat dissipation film 130 may not be provided, the blocking member 190 may be attached to the first surface of the first substrate 111 and the second surface of the lower cover 180. The blocking member 190 may prevent the vibration of the display panel 110, caused by the first, second, and third sound generators 210, 220 and 230 or sound generated by the vibration of the display panel 110, from being transmitted. FIGS. 4 and 5 illustrate that the blocking member 190 may be disposed along the four sides of the heat dissipation film 130, but the disclosure may not be limited thereto. The blocking member 190 may be disposed between the first and second sound generators 210 and 220 in a plan view so that the vibration of the display panel 110, which may be caused by the second sound generator 220 may be prevented from being affected by the vibration of the display panel 110, which may be caused by the first sound generator 210. Also, the blocking member 190 may be disposed between the first and third sound generators 210 and 230 in a plan view so that the vibration of the display panel 110, which may be caused by the third sound generator 220, may be prevented from being affected by the vibration of the display panel 110, which may be caused by the first sound generator 210.

As illustrated in FIG. 4, the blocking member 190 may include a base film 191, a buffer layer 192, a sacrificial layer 193, a first adhesive layer 194, and a second adhesive layer 195.

The base film 191 may be formed of plastic. For example, the base film 191 may be formed of PET, but the disclosure may not be limited thereto such that another material may form the base film 191.

The buffer layer 192 may be disposed on a first surface of the base film 191. The buffer layer 192 may be formed of foam with elasticity. For example, the buffer layer 192 may be formed of polyurethane (PU), silicone, rubber, or aerogel, but the disclosure may not limited thereto.

The sacrificial layer 193 may be disposed on a first surface of the buffer layer 192. The sacrificial layer 193 may serve as a separating layer in a case that the blocking member 190 may need to be detached. Parts of the first adhesive layer 194 and the sacrificial layer 193 may remain on the second surface of the lower cover 180. The sacrificial layer 193 may be formed of a material with low elasticity. For example, the sacrificial layer 193 may be formed of PU, but the disclosure may not be limited thereto, and the sacrificial layer 193 may not be provided.

The first adhesive layer 194 may be disposed on a first surface of the sacrificial layer 193. The first adhesive layer 194 may be attached to the second surface of the lower cover 180. The second adhesive layer 195 may be disposed on a second surface of the base film 191. The second adhesive film 195 may be attached to the first surface of the heat dissipation film 130. The first and second adhesive layers 194 and 195 may be acrylic adhesives or silicone adhesives.

According to the embodiment of FIGS. 3 through 5, the first sound circuit board 251, which may be connected to the second sound generator 220, may be connected to the control circuit board 160 through the first cable hole CHL which may penetrate the lower cover 180. Thus, even if the second sound generator 220 may be disposed on the first surface of the heat dissipation film 130 and the control circuit board 160 may be disposed on the first surface of the lower cover 180, the control circuit board 160 and the second sound generator 220 may be electrically connected.

FIG. 6 shows a schematic cross-sectional view illustrating the first substrate, the second substrate, and the pixel array layer of the display panel of FIG. 2.

Referring to FIG. 6, the display panel 110 may include the first substrate 111, the second substrate 112, and the pixel array layer 113. The pixel array layer 113 may include the TFT layer TFTL and the light-emitting element layer EML.

The buffer film 302 may be formed on the first surface of the first substrate 111 that may face the second substrate 112. The buffer film 302 may be formed on the first substrate 111 to protect the TFTs 335 and the light-emitting elements against moisture that may penetrate the first substrate 111. The buffer film 302 may consist of inorganic films that may be alternately stacked. For example, the buffer film 302 may be formed as a multilayer film in which at least one inorganic film selected from among a silicon oxide (SiOx) film, a silicon nitride (SiNx) film, and a silicon oxynitride (SiON) film may be alternately stacked. The buffer film 302 may not be provided.

The TFT layer TFTL may be formed on the buffer film 302. The TFT layer TFTL may include TFTs 335, a gate insulating film 336, an interlayer insulating film 337, a passivation film 338, and a planarization film 339.

The TFTs 335 may be formed on the buffer film. Each of the TFTs 335 may include an active layer 331, a gate electrode 331, a source electrode 333, and a drain electrode 334. FIG. 6 illustrates that the TFTs 335 may have a top gate structure in which the gate electrode 332 may be disposed above the active layer 331, but the disclosure may not be limited thereto. For example, the TFTs 335 may have a bottom gate structure in which the gate electrode 332 may be disposed below the active layer 331 or a double gate structure in which the gate electrode 332 may be disposed both above and below the active layer 331.

The active layer 331 may be formed on the buffer film. The active layer 331 may be formed of a silicon-based semiconductor material or an oxide-based semiconductor material. A light-shielding layer for blocking external light incident on the active layer 331 may be formed between the buffer film and the active layer 331.

The gate insulating film 336 may be formed on the active layer 331. The gate insulating film 316 may be formed as an inorganic film such as, for example, a silicon oxide film, a silicon nitride film, or a multilayer film thereof.

The gate electrode 332 and a gate line may be formed on the gate insulating film 316. The gate electrode 332 and the gate line may be formed as single- or multilayer films using molybdenum (Mo), Al, chromium (Cr), gold (Au), titanium (Ti), Ni, neodymium (Nd), Cu, or an alloy thereof.

The interlayer insulating film 337 may be formed on the gate electrode 332 and the gate line. The interlayer insulating film 337 may be formed as an inorganic film such as, for example, a silicon oxide film, a silicon nitride film, or a multilayer film thereof.

The source electrode 333, the drain electrode 334, and a data line may be formed on the interlayer insulating film 337. The source electrode 333 and the drain electrode 334 may be connected to the active layer 331 through contact holes penetrating the gate insulating film 336 and the interlayer insulating film 337. The source electrode 333, the drain electrode 334, and the data line may be formed as single-layer or multilayer film using Mo, Al, Cr, Au, Ti, Ni, Nd, Cu, or an alloy thereof.

The passivation film 338 may be formed on the source electrode 33, the drain electrode 334, and the data line to insulate the TFTs 335. The passivation film 338 may be formed as an inorganic film such as, for example, a silicon oxide film, a silicon nitride film, or a multilayer film thereof.

The planarization film 339 may be formed on the passivation film 338 to planarize height differences formed by the TFTs 335. The planarization film 339 may be formed as an organic film using an acrylic resin, an epoxy resin, a phenolic resin, a polyamide resin, or a polyimide resin.

The light-emitting element layer EML may be formed on the TFT layer 330. The light-emitting element layer EML may include the light-emitting elements and a pixel-defining film 344.

The light-emitting elements and the pixel-defining film 344 may be formed on the planarization film 339. The light-emitting elements may be OLEDs. Each of the light-emitting elements may include an anode electrode 341, a light-emitting layer 342, and a cathode electrode 343.

The anode electrode 341 may be formed on the planarization film 339. The anode electrode 341 may be connected to the source electrode 333 through a contact hole penetrating the passivation film 338 and the planarization film 339.

The pixel-defining film 344 may be formed to cover the edges of the anode electrode 341 to define a corresponding pixel. For example, the pixel-defining film 344 may define the subpixels (PX1, PX2, and PX3). Each of the pixels may be a region in which the anode electrode 341, the light-emitting layer 342, and the cathode electrode 343 may be sequentially stacked and holes from the anode electrode 341 and electrons from the cathode electrode 343 may be combined in the light-emitting layer 342 to emit light.

The light-emitting layer 342 may be formed on the anode electrode 341 and the pixel-defining film 344. The light-emitting layer 342 may be an organic light-emitting layer. The light-emitting layer 342 may emit short-wavelength light such as blue light or ultraviolet (UV) light. The peak wavelength of blue light may range from about 450 nm to about 490 nm and may be lower than the peak wavelength of UV light. The light-emitting layer 342 may be a common layer formed in common for all the subpixels (PX1, PX2, and PX3), and the display panel 110 may include the wavelength conversion layer QDL for converting short-wavelength light such as blue light or UV light into red light, green light, and blue light and the color filter layer CFL for transmitting red light, green light, and blue light therethrough.

The light-emitting layer 342 may include a hole transport layer, an emission layer, and an electron transport layer. The light-emitting layer 342 may have a tandem structure with two or more stacks, in which case, a charge generating layer may be formed between the stacks.

The cathode electrode 343 may be formed on the light-emitting layer 342. The cathode electrode 343 may be formed to cover the light-emitting layer 342. The cathode electrode 343 may be a common layer formed commonly for all pixels.

In a case where the light-emitting element layer EML may be formed as a top emission-type light-emitting element layer that emits light in a direction toward the second substrate 112, i.e., in an upper direction, the anode electrode 341 may be formed of a metallic material with high reflectance such as a stack of Al and Ti (e.g., Ti/Al/Ti), a stack of Al and indium tin oxide (ITO) (e.g., ITO/Al/ITO), a silver (Ag)-palladium (Pd)-copper (Cu) (APC) alloy, or a stack of an APC alloy and ITO (e.g., ITO/APC/ITO), and the cathode electrode 343 may be formed of a transparent conductive oxide (TCO) material such as ITO or indium zinc oxide (IZO) that may transmit light therethrough or a semi-transparent metallic material such as magnesium (Mg), Ag, or an alloy thereof. In a case where the cathode electrode 343 may be formed of a semi-transparent metallic material, the emission efficiency of the light-emitting element layer EML may be improved due to a micro-cavity effect.

The encapsulation film 345 may be formed on the light-emitting element layer EML. The encapsulation film 345 may prevent oxygen or moisture from infiltrating into the light-emitting layer 342 and the cathode electrode 343. The TFEL may include an encapsulation film 345 that may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The encapsulation film 345 may further include at least one organic film. The organic film may be formed to a sufficient thickness to prevent foreign particles from entering the light-emitting layer 342 and the cathode electrode 343 through the encapsulation film 345. The organic film may include one of epoxy, acrylate, and urethane acrylate.

The color filter layer CFL may be disposed on the first surface of the second substrate 112 that faces the first substrate 111. The color filter layer CFL may include a black matrix 360 and color filters 370.

The black matrix 360 may be formed on the first surface of the second substrate 112. The black matrix 360 may be disposed to not overlap with or face the subpixels (PX1, PX2, and PX3), but may overlap with or face the pixel-defining film 344. The black matrix 360 may include a black pigment or an opaque metallic material capable of blocking the transmission of light without transmitting light therethrough.

The color filters 370 may be disposed to overlap with or face the subpixels (PX1, PX2, and PX3). First color filters 371 may be disposed to overlap with or face first subpixels PX1, second color filters 372 may be disposed to overlap with or face second subpixels PX2, and third color filters 373 may be disposed to overlap with or face third subpixels PX3. The first color filters 371 may be light-transmitting filters capable of transmitting light of a first color therethrough, the second color filters 372 may be light-transmitting filters capable of transmitting light of a second color therethrough, and the third color filters 373 may be light-transmitting filters capable of transmitting light of a third color therethrough. For example, the first, second, and third colors may be red, green, and blue, respectively, but the disclosure may not be limited thereto. For example, the peak wavelength of red light transmitted through the first color filters 371 may range from about 620 nm to about 750 nm, the peak wavelength of green light transmitted through the second color filters 372 may range from about 500 nm to about 570 nm, and the peak wavelength of blue light transmitted through the third color filters 373 may range from about 450 nm to about 490 nm.

The borders between pairs of adjacent color filters 370 may overlap with or face the black matrix 360. Accordingly, light emitted from the light-emitting layer 342 of one subpixel may be prevented from proceeding to neighboring subpixels to be mixed with light emitted from the light-emitting layers 342 of the neighboring subpixels.

An overcoat layer for planarizing height differences formed by the color filters 370 and the black matrix 360 may be formed on the color filters 370. The overcoat layer may not be provided.

The wavelength conversion layer QDL may be disposed on the color filter layer CFL. The wavelength conversion layer QDL may include a first capping layer 351, a first wavelength conversion layer 352, a second wavelength conversion layer 353, a third wavelength conversion layer 354, a second capping layer 355, an interlayer organic film 356, and a third capping layer 357.

The first capping layer 351 may be disposed on the color filter layer CFL. The first capping layer 351 may prevent external moisture or oxygen from penetrating the first, second, and third wavelength conversion layers 352, 353, and 354 through the color filter layer CFL. The first capping layer 351 may be formed of an inorganic material such as, for example, silicon nitride, aluminum nitride, zirconium nitride, titanium nitride, hafnium nitride, tantalum nitride, silicon oxide, aluminum oxide, or a titanium oxide.

The first, second, and third wavelength conversion layers 352, 353, and 354 may be disposed on the first capping layer 351.

The first wavelength conversion layer 352 may be disposed to overlap with or face the first subpixels PX1. The first wavelength conversion layer 352 may convert short-wavelength light emitted from the light-emitting layers 342 of the first subpixels PX1 such as blue light or UV light into light of the first color. The first wavelength conversion layer 352 may include a first base resin, a first wavelength shifter, and a first scatterer.

The first base resin may be formed of a material having high light transmittance and having an excellent dispersion characteristic for the first wavelength shifter and the first scatterer. For example, the first base resin may include an organic material such as an epoxy resin, an acrylic resin, a cardo resin, or an imide resin.

The first wavelength shifter may convert or shift the wavelength of incident light. The first wavelength shifter may be quantum dots, quantum rods, or a phosphor. In a case where the first wavelength shifter may include quantum dots, the first wavelength shifter may have a predetermined band gap as a semiconductor nanocrystal material depending on its composition and particle size. Accordingly, the first wavelength shifter may absorb incident light and may emit light having a predetermined wavelength. Also, the first wavelength shifter may have a core-shell structure consisting of cores including cores and shells surrounding or around the cores. Examples of nanocrystals that form the cores include group IV nanocrystals, group II-VI compound nanocrystals, group III-V compound nanocrystals, group IV-VI nanocrystals, or a combination thereof. The shells may serve as protective layers for maintaining semiconductor properties by preventing chemical denaturation of the cores and/or as charging layers for imparting electrophoretic properties to the quantum dots. The shells may have a single- or multilayer structure. Examples of the shells may include an oxide of a metal or a nonmetal, a semiconductor compound, and a combination thereof.

The first scatterer may have a different refractive index from the first base resin and may form an optical interface with the first base resin. For example, the first scatterer may be light-scattering particles. For example, the first scatterer may be particles of a metal oxide such as silicon titanium ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). In another example, the first scatterer may be organic particles such as acrylic resin particles or urethane resin particles.

The first scatterer may scatter light in random directions without substantially changing the wavelength of the light that passes through the first wavelength conversion layer 352. Accordingly, the path of light passing through the first wavelength conversion layer 352 may be elongated, and as a result, the color conversion efficiency of the first wavelength shifter may be improved.

The first wavelength conversion layer 352 may overlap with or face the first color filters 371. Accordingly, some of the short-wavelength light (e.g., blue light or UV light) provided by the first subpixels PX1 may pass through the first wavelength conversion layer 352 unaltered, i.e., without being converted into light of the first color. However, the blue light or UV light incident upon the first color filters 371 that may not be converted by the first wavelength conversion layer 352 may not pass through the first color filters 371. Light of the first color provided by the first wavelength conversion layer 352 may pass through the first color filers 371 and may thus be emitted in the direction toward the second substrate 112.

The second wavelength conversion layer 353 may be disposed to overlap with or face the second subpixels PX2. The second wavelength conversion layer 353 may convert short-wavelength light emitted from the light-emitting layers 342 of the second subpixels PX2 such as blue light or UV light into light of the second color. The second wavelength conversion layer 353 may include a second base resin, a second wavelength shifter, and a second scatterer. The second base resin, the second wavelength shifter, and the second scatterer may be substantially the same as their respective counterparts of the first wavelength conversion layer 352, and thus, detailed descriptions thereof will be omitted. In a case where the first and second wavelength shifters may both include quantum dots, the particle diameter of the second wavelength shifter may be smaller than the particle diameter of the first wavelength shifter.

The second wavelength conversion layer 353 may overlap with or face the second color filters 372. Accordingly, some of the short-wavelength light (e.g., blue light or UV light) provided by the second subpixels PX2 may pass through the second wavelength conversion layer 353 unaltered, i.e., without being converted into light of the second color. However, the blue light or UV light incident upon the second color filters 372 that may not be converted by the second wavelength conversion layer 353 may not pass through the second color filters 372. Light of the second color provided by the second wavelength conversion layer 353 may pass through the second color filers 372 and may thus be emitted in the direction toward the second substrate 112.

The third wavelength conversion layer 354 may be disposed to overlap with or face the third subpixels PX3. The third wavelength conversion layer 354 may convert short-wavelength light emitted from the light-emitting layers 342 of the third subpixels PX3 such as blue light or UV light into light of the third color. The third wavelength conversion layer 354 may include a third base resin and a third scatterer. The third base resin and the third scatterer may be substantially the same as their respective counterparts of the first wavelength conversion layer 352, and thus, detailed descriptions thereof will be omitted.

The third wavelength conversion layer 354 may overlap with or face the third color filters 373. Accordingly, some of the short-wavelength light (e.g., blue light or UV light) provided by the third subpixels PX3 may pass through the third wavelength conversion layer 354 unaltered, and may thus be emitted in the direction toward the second substrate 112.

The second capping layer 355 may be disposed on the first, second, and third wavelength conversion layers 352, 353, and 354 and on part of the first capping layer 351 that may not be covered, but exposed, by the first, second, and third wavelength conversion layers 352, 353, and 354. The second capping layer 355 may prevent external moisture or oxygen from penetrating the first, second, and third wavelength conversion layers 352, 353, and 354. The second capping layer 355 may be formed of an inorganic material such as, for example, silicon nitride, aluminum nitride, zirconium nitride, titanium nitride, hafnium nitride, tantalum nitride, silicon oxide, aluminum oxide, or a titanium oxide.

The interlayer organic film 356 may be disposed on the second capping layer 355. The interlayer organic film 356 may be a planarization layer for planarizing height differences formed by the first, second, and third wavelength conversion layers 352, 353, and 354. The interlayer organic film 356 may be formed of an organic material such as an acrylic resin, an epoxy resin, a phenolic resin, a polyamide resin, or a polyimide resin.

The third capping layer 357 may be disposed on the interlayer organic film 356. The third capping layer 357 may be formed of an inorganic material such as, for example, silicon nitride, aluminum nitride, zirconium nitride, titanium nitride, hafnium nitride, tantalum nitride, silicon oxide, aluminum oxide, or a titanium oxide.

The filler member FL may be disposed between the thin-film encapsulation layer TFEL 345, which may be disposed on the first substrate 111 and the third capping layer 357, which may be disposed on the second substrate 112. The filler member FL may be formed of a material having a buffer function. For example, the filler member 70 may be formed of an organic material such as an acrylic resin, an epoxy resin, a phenolic resin, a polyamide resin, or a polyimide resin.

A sealing member which may bond the first and second substrates 111 and 112 may be isposed in the non-display area of the display panel 110, and in a plan view, the filler member FL may be surrounded by the sealing member, i.e., the sealing member may be around the filler member FL. The sealing member may be glass frit or a sealant.

According to the embodiment of FIG. 6, the subpixels (PX1, PX2, and PX3) may emit short-wavelength light such as blue light or UV light. Light emitted from the first subpixels PX1 may be converted into light of the first color by the first wavelength conversion layer 352 and output through the first color filters CF1. Light emitted from the second subpixels PX2 may be converted into light of the second color by the second wavelength conversion layer 353 and output through the second color filters CF2. Light emitted from the third subpixels PX3 may be output through the third wavelength conversion layer 354 and the third color filters CF3. Accordingly, white light may be output.

According to the embodiment of FIG. 6, since the subpixels (PX1, PX2, and PX3) may be formed to be of a top emission type and thus to emit light in the direction toward the second substrate 112, i.e., in an upward direction, the heat dissipation film 130, which may include an opaque material such as graphite or Al, may be disposed on the first surface of the first substrate 111.

FIGS. 7 and 8 illustrate how the display panel of FIG. 2 may be vibrated by the first sound generator of FIG. 2.

Referring to FIGS. 7 and 8, the first sound generator 210 may be an exciter that vibrates the display panel 110 by generating a magnetic force using a voice coil. A hole in which the first sound generator 210 may be disposed may be formed in the lower cover 180.

The first sound generator 210 may include the magnet 211, the bobbin 212, the voice coil 213, a damper 214, the plate 215, the first fixing members 216, and second fixing members 217.

The magnet 211 may be a permanent magnet A sintered magnet such as a barium ferrite magnet may be used. The magnet 211 may be formed as a ferric trioxide ($Fe_2O_3$) magnet, a barium carbonate ($BaCO_3$) magnet, a neodymium (Nd) magnet, a strontium ferrite magnet with an improved magnetic component, or an Al, nickel (Ni), or cobalt (Co) cast alloy magnet, but the disclosure may not be limited thereto. The Nd magnet may be, for example, a neodymium-iron-boron (Nd—Fe—B) magnet.

The magnet 211 may include a flat part 211a, a central protruding part 211b protruding from the center of the flat part 211a, and a sidewall part 211c protruding from the edge of the flat part 211a. The central protruding part 211b and the sidewall part 211c may be a predetermined distance apart from each other, and as a result, a predetermined space may be formed between the central protruding part 211b and the sidewall part 211c. For example, the magnet 211 may have a cylindrical shape. The magnet 211 may be in the shape of a cylinder with a circular space formed at one of the bases thereof.

The central protruding part 211b of the magnet 211 may have N-pole magnetism, and the flat part 211a and the sidewall part 211c may have S-pole magnetism. As a result, an external magnetic field may be formed between the central protruding part 211b and the flat part 211a of the magnet 211 and between the central protruding part 211b and the sidewall part 211c of the magnet 211.

The bobbin 212 may be formed into a cylindrical shape. The central protruding part 211b of the magnet 211 may be disposed in the bobbin 212. For example, the bobbin 212 may be disposed to surround or be around the central protruding part 211b of the magnet 211. The sidewall part 211c of the magnet 211 may be disposed on the outside of the bobbin 212. For example, the sidewall part 211c of the magnet 211 may be disposed to surround the bobbin 212. Spaces may be formed between the bobbin 212 and the central protruding part 211b of the magnet 211 and between the bobbin 212 and the sidewall part 211c of the magnet 211.

The bobbin 212 may be formed of a pulp or paper-processed material, Al, Mg, or an alloy thereof, a synthetic resin such as polypropylene, or polyamide-based fibers. One end of the bobbin 212 may be attached to the heat dissipation film 130 via an adhesive member. The adhesive member may be a double-sided tape.

The voice coil 213 may be wound around the outer circumferential surface of the bobbin 212. One end of the voice coil 213 may be electrically connected to the first sound wire WL1, and the other end of the voice coil 213 may be electrically connected to the second sound wire WL2. Accordingly, the voice coil 213 may receive "1A" and "1B" driving voltages from the sound driver 171.

The damper 214 may be disposed between the bobbin 212 and the plate 215. The damper 214 may be fixed to the bobbin 212 on one side and to the plate 215 on the other side via the second fixing members 217, such as screws. The second fixing members 217 may be inserted and fixed in damper holes formed in the damper 214 and second fixing holes formed in the plate 215. The damper holes of the damper 214 and the second fixing holes of the plate 215 may be screw holes into which screws can be fastened. The damper holes of the damper 214 may be holes that penetrate the damper 214, and the second fixing holes of the plate 215 may be holes that penetrate the plate 215 completely or partially.

The damper 214 may have elasticity and may be formed of a conductive material. The damper 214 may control the vertical vibration of the bobbin 212 while contracting or expanding in accordance with the vertical movement of the bobbin 212. For example, since the damper 214 may be connected to the bobbin 212 and the plate 215, the vertical movement of the bobbin 212 may be limited by the restoring force of the damper 214. For example, if the bobbin 212 vibrates beyond or below a predetermined height, the bobbin 212 may return to its original location due to the restoring force of the damper 214.

The plate 215 may be disposed on the bottom surface of the magnet 211. The plate 215 may be formed as one integral body with the magnet 211 or may be formed as a separate element from the magnet 211. In a case where the plate 215 may be formed as a separate element from the magnet 211, the magnet 211 may be attached to the plate 215 via an adhesive member such as a double-sided tape. The plate 215 may be fixed to the lower cover 180 via the first fixing members 216.

The direction in which the first fixing members 216 may be fixed may be opposite to the direction in which the second fixing members 217 may be fixed. For example, as illustrated in FIGS. 7 and 8, the first fixing members 216 may be fixed in the second direction (or the Y-axis direction), and the second fixing members 217 may be fixed in the opposite direction of the second direction (or the opposite direction of the Y-axis direction).

The plate 215 may be bent between an area 215a where the magnet 211 may be disposed and an area where the first fixing members 216 and the second fixing members 216 may be disposed. The area 215a where the magnet 211 may be disposed may be recessed further than the area 215b where the first fixing members 216 and the second fixing members 217 may be disposed. Accordingly, the distance between the area 215a where the magnet 211 may be disposed and the first substrate 111 or the heat dissipation film 130 may be greater than the distance between the area 215b where the first fixing members 216 and the second fixing members 217 may be disposed and the first substrate 111 or the heat dissipation film 130. Accordingly, since the distance between the lower cover 180 and the first substrate 111 may be minimized without the need to reduce the height of the first sound generator 210, the thickness of the display device 10 may be reduced. The height of the first sound generator 210 may refer to the distance between an end of the bobbin 212 that may be in contact with the heat dissipation film 130 and the plate 215 that may be in contact with the magnet 211.

Since one end of the voice coil 213 may be electrically connected to the sound driver 171 via the first sound wire WL1, the voice coil 213 may receive the "1A" driving voltage from the sound driver 171. Also, since the other end of the voice coil 213 may be electrically connected to the sound driver 171 via the second sound wire WL2, the voice coil 213 may receive the "1B" driving voltage from the sound driver 171. A current may flow in the voice coil 213 in accordance with the "1A" or "1B" driving voltage. An applied magnetic field may be formed around the voice coil 213 depending on the current that flows in the voice coil 213. For example, the direction of the current that flows in the voice coil 213 in a case that the "1A" driving voltage may be a positive voltage and the "1B" driving voltage may be a negative voltage may be opposite to the direction of the current that flows in the voice coil 213 in a case that the "1A" driving voltage may be a negative voltage and the "1B" driving voltage may be a positive voltage. Since the first and "1B" driving voltages may be alternately driven, the N pole and the S pole of the applied magnetic field may be changed so that an attracting force and a repulsive force may be alternately acted upon by the magnet 211 and the voice coil 213. Accordingly, as illustrated in FIGS. 7 and 8, the bobbin 212 having the voice coil 213 wound therearound may reciprocate in the third direction (or the Z-axis direction). Therefore, as illustrated in FIGS. 7 and 8, the display panel 110 may vibrate in the third direction (or the Z-axis direction), and as a result, sound may be output.

The magnet 211 and the plate 215 may be fixed to the lower cover 180, but the disclosure may not be limited thereto. For example, the magnet 211 and the plate 215 may be fixed to the control circuit board 160, the system circuit board, the power supply circuit board, a sound circuit board, or a dummy circuit board, instead of the lower cover 180. The control circuit board 160, the system circuit board, the power supply circuit board, the sound circuit board, or the dummy circuit board may refer to a circuit board where no other elements than the magnet 211 and the plate 215 of the first sound generator 210 and an amplifier for amplifying the first sound signal, which may be provided to the first sound generator 210, may be disposed. The dummy circuit board may be a PCB or an FPCB.

According to the embodiment of FIGS. 7 and 8, the bobbin 212 may be fixed to the first substrate 111 or the heat dissipation film 130, and the plate 215 with the magnet 211 coupled thereto may be fixed to the lower cover 180. Since the lower cover 180, which may support the magnet 211, may be more rigid than the display panel 110, the bobbin 212 having the voice coil 213 wound therearound may reciprocate from the magnet 211, which may be fixed, in accordance with an applied magnetic field. As the bobbin 212 reciprocates, the display panel 110 may vibrate in the third direction (or the Z-axis direction), as illustrated in FIGS. 7 and 8, and as a result, sound may be output.

According to the embodiment of FIGS. 7 and 8, the plate 215 may be bent in the area 215a where the magnet 211 may be disposed and the area 215b where the first fixing members 216 and the second fixing members 217 may be disposed. Accordingly, since the distance between the lower cover 180 and the first substrate 111 may be minimized without the need to reduce the height of the first sound generator 210, the thickness of the display device 10 may be reduced.

Figure 9:
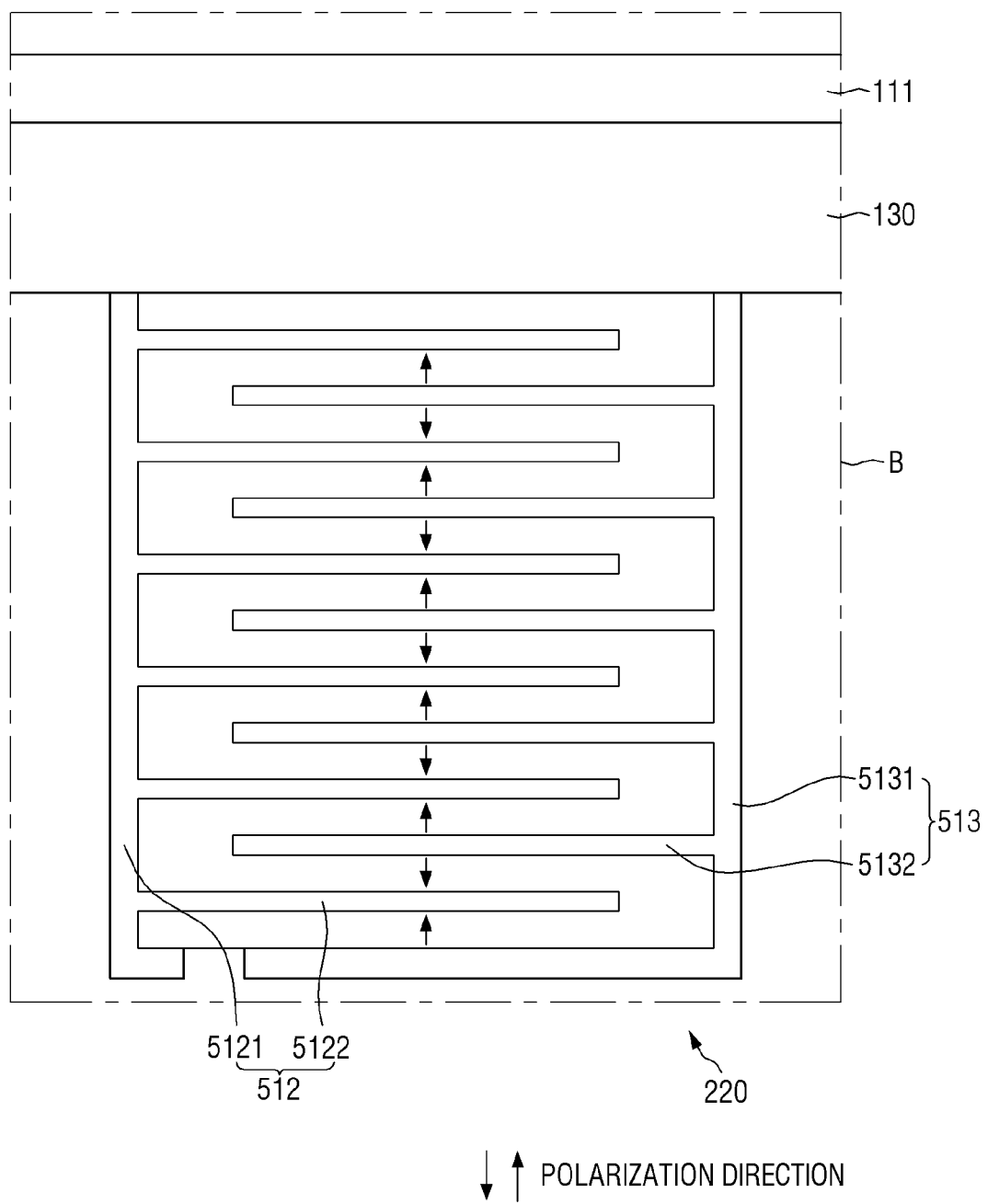
FIG. 9 show a schematic cross-sectional view illustrating a second sound generator of FIG. 2.
Figure 10:
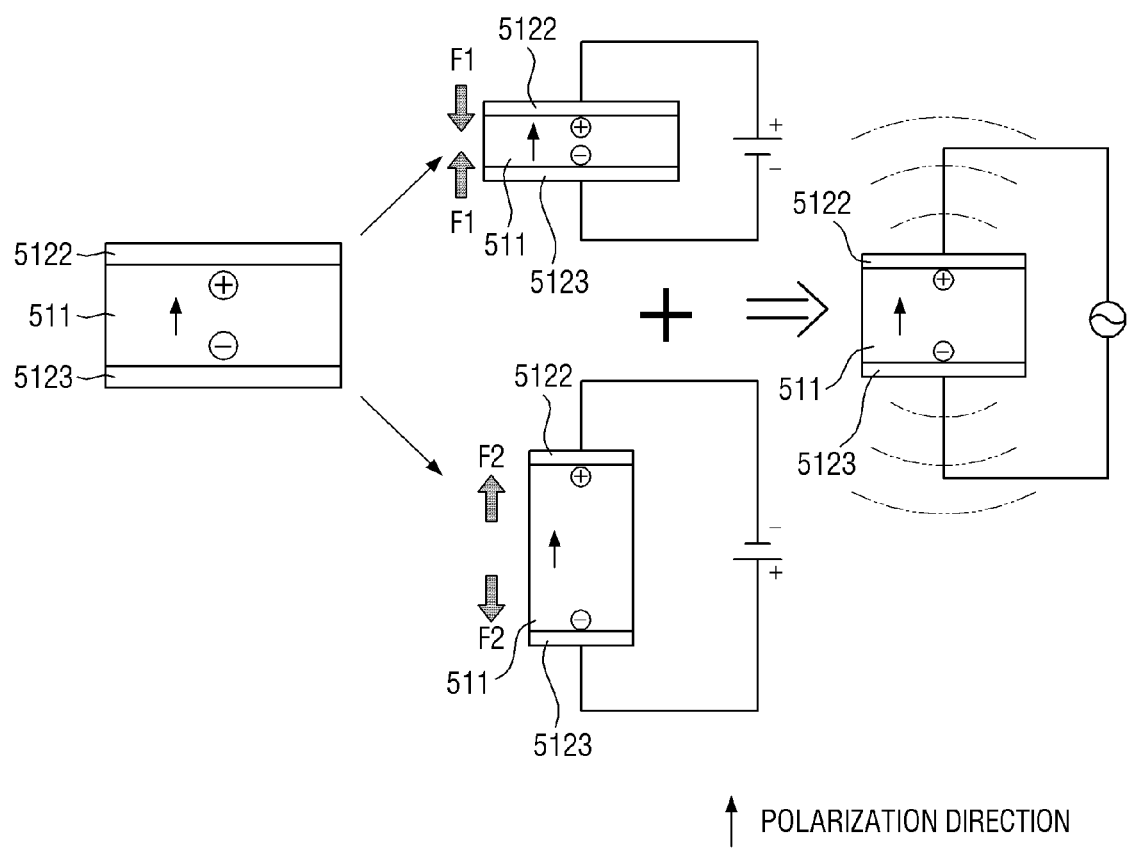
FIG. 10 illustrates how a vibration layer disposed between first branch electrodes and second branch electrodes of the second sound generator of FIG. 2 vibrates.
Figure 11:
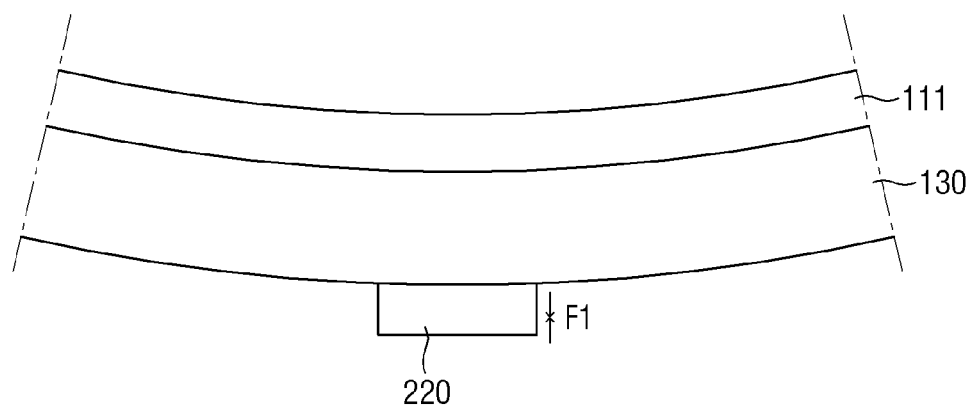
FIGS. 11 and 12 show side views illustrating how the display panel of FIG. 2 may be vibrated by the vibration of the second sound generator of FIG. 2.
Figure 12:
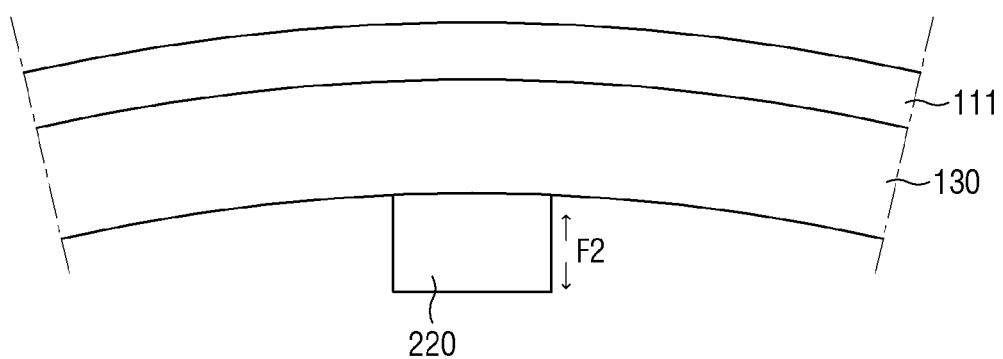
Figure 12:
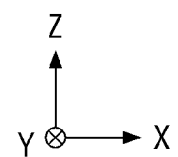

FIG. 9 shows a schematic cross-sectional view illustrating the second sound generator of FIG. 2. FIG. 10 illustrates how a vibration layer disposed between first branch electrodes and second branch electrodes of the second sound generator of FIG. 2 may vibrate. FIGS. 11 and 12 show side views illustrating how the display panel of FIG. 2 may be vibrated by the vibration of the second sound generator of FIG. 2.

Referring to FIGS. 9 through 12, the second sound generator 220 may be a piezoelectric element or actuator capable of vibrating the display panel 110 using a piezoelectric material that may contract or expand in accordance with a voltage applied thereto. The second sound generator 220 may include a vibration layer 511, a first electrode 512, and a second electrode 513.

The first electrode 512 may include a first stem electrode 5121 and first branch electrodes 5122. The first stem electrode 5121 may be disposed on at least one side of the vibration layer 511, as illustrated in FIG. 9. As another example, the first stem electrode 5121 may be disposed to penetrate part of the vibration layer 511. The first stem electrode 5121 may be disposed on the top surface of the vibration layer 511. The first branch electrodes 5122 may be branched off from the first stem electrode 5121. The first branch electrodes 5122 may be disposed in parallel to one another.

The second electrode 513 may include a second stem electrode 5131 and second branch electrodes 5132. The second electrode 513 may be disposed apart from the first electrode 512. Accordingly, the second electrode 513 may be electrically isolated from the first electrode 512. The second stem electrode 5131 may be disposed on at least one side of the vibration layer 511. The first stem electrode 5121 may be disposed on a first side of the vibration layer 511, and the second stem electrode 5131 may be disposed on a second side of the vibration layer 511. As another example, the second stem electrode 5131 may be disposed to penetrate part of the vibration layer 511. The second stem electrode 5131 may be disposed on the top surface of the vibration layer 511. The first and second stem electrodes 5121 and 5131 may not overlap with each other. In other words, the first and second stem electrodes 5121 and 5131 may be offset from each other. The second branch electrodes 5132 may be branched off from the second stem electrode 5131. The second branch electrodes 5132 may be disposed in parallel to one another.

The first branch electrodes 5122 and the second branch electrodes 5132 may be disposed in parallel to one another in a horizontal direction (or a X- or Y-axis direction). The first branch electrodes 5122 and the second branch electrodes 5132 may be alternately disposed in a vertical direction (or a Z-axis direction). For example, the first branch electrodes 5122 and the second branch electrodes 5132 may be disposed repeatedly in the order of a first branch electrode 5122, a second branch electrode 5132, a first branch electrode 5122, and a second branch electrode 5132 along the vertical direction (or the Z-axis direction).

The first and second electrodes 512 and 513 may be connected to the pads of the first or second sound circuit board 251 or 252. The pads of the first or second sound circuit board 251 or 252 may be connected to the first and second electrodes 512 and 513, which may be disposed on a first surface of the second sound generator 220.

The vibration layer 511 may be a piezoelectric actuator that may be deformed by the "2A" and "2B" driving voltages applied to the first and second electrodes 512 and 513, respectively. The vibration layer 511 may be one of a piezoelectric material such as a polyvinylidene difluoride (PVDF) film or lead zirconate titanate (PZT) and an electroactive polymer.

Since the vibration layer 511 may be fabricated at a high temperature, the first and second electrodes 512 and 513 may be formed of a metal with a high melting point such as Ag or an alloy of Ag and Pd. In a case where the first and second electrodes 512 and 513 may be formed of an alloy of Ag and Pd, an amount of the Ag of the alloy of Ag and Pd may be greater than an amount of the Pd of the alloy of Ag and Pd in order to raise the melting point of the first and second electrodes 512 and 513.

The vibration layer 511 may be disposed between the first branch electrodes 5122 and the second branch electrodes 5132. The vibration layer 511 may contract or expand depending on the difference between the "2A" driving voltage applied to the first branch electrodes 5122 of the first electrode 512 and the "2B" driving voltage applied to the second branch electrodes 5132 of the second electrode 513.

As illustrated in FIG. 10, in a case where the polarity of the vibration layer 511 between the first branch electrodes 5122 and their respective underlying second branch electrodes 5132 may have an upward direction (↑) the vibration layer 511 may have a positive polarity in upper parts thereof adjacent to the first branch electrodes 5122 and a negative polarity in lower parts thereof adjacent to the second branch electrodes 5132. In a case where the polarity of the vibration layer 511 between the second branch electrodes 5132 and their respective underlying first branch electrodes 5122 may have a downward direction (↓), the vibration layer 511 may have a negative polarity in the upper parts thereof adjacent to the first branch electrodes 5122 and a positive polarity in the lower parts thereof adjacent to the second branch electrodes 5132. The direction of the polarity of the vibration layer 511 may be determined by a poling process for applying an electric field to the vibration layer 511 using the first branch electrodes 5122 and the second branch electrodes 5132.

In a case where the direction of the polarity of the vibration layer 511 between the first branch electrodes 5122 and their respective underlying second branch electrodes 5132 may be the upward direction (↑) as illustrated in FIG. 10, a positive "2A" driving voltage and a negative "2B" driving voltage may be applied to the first branch electrodes 5122 and the second branch electrodes 5132, respectively. The vibration layer 511 may contract in accordance with a first force F1. The first force F1 may be a contraction force. In response to a negative "2A" driving voltage and a positive "2B" driving voltage being applied to the first branch electrodes 5122 and the second branch electrodes 5132, respectively, the vibration layer 511 may expand in accordance with a second force F2. The second force F2 may be an extension force.

Similarly, in a case where the direction of the polarity of the vibration layer 511 between the second branch electrodes 5132 and their respective underlying first branch electrodes 5122 may be the downward direction (↓), the positive "2A" driving voltage and the negative "2B" driving voltage may be applied to the second branch electrodes 5132 and the first branch electrodes 5122, respectively. The vibration layer 511 may expand in accordance with an extension force. In response to the negative "2A" driving voltage and the positive "2B" driving voltage may be applied to the second branch electrodes 5132 and the first branch electrodes 5122, respectively. The vibration layer 511 may contract in accordance with a contraction force.

In a case where the "2A" and "2B" driving voltages applied to the first and second electrodes 512 and 513, respectively, alternately change from a positive polarity to a negative polarity repeatedly, the vibration layer 511 may repeatedly contract and expand. As a result, the second sound generator 220 may vibrate. Since the second sound generator 220 may be attached to the first surface of the heat dissipation film 130, the display panel 110 may vibrate in the third direction (or the Z-axis direction), which may be the thickness direction of the display panel 110. The vibration may occur due to stress, as illustrated in FIGS. 11 and 12, in response to the contraction and expansion of the vibration layer 511 of the second sound generator 220. Since the display panel 110 may be vibrated by the second sound generator 220, the display device 10 may output sound.

The third sound generator 230 may be substantially the same as the second sound generator 220 described above with reference to FIGS. 9 through 12, and thus, a detailed description thereof will be omitted.

Figure 13:
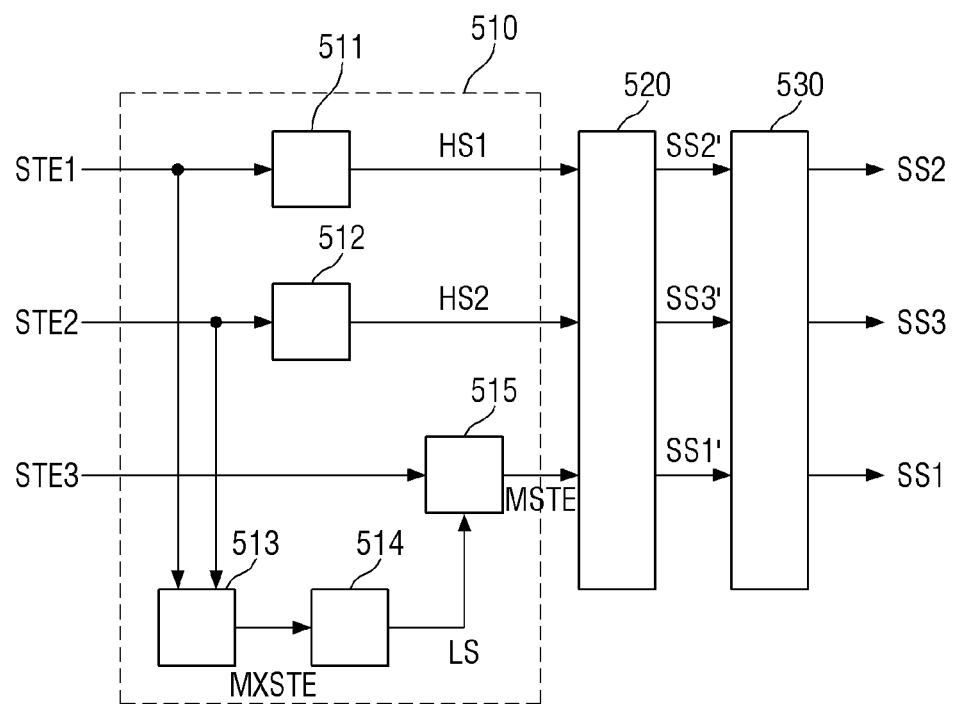
FIG. 13 shows a block diagram illustrating a sound driver according to an embodiment of the disclosure.

FIG. 13 shows a block diagram illustrating a sound driver according to an embodiment of the disclosure.

Referring to FIG. 13, the sound driver 171 may include a digital signal processing unit or digital signal processor 510, a digital-to-analog converter 520, and an amplifier 530.

The digital signal processing unit 510 processes first, second, and third stereo signals STE1, STE2, and STE3, which may be input digital signals. In a case that the first, second, and third stereo signals STE1, STE2, and STE3 may be analog signals, the digital signal processing unit 510 may convert the first, second, and third stereo signals STE1, STE2, and STE3 into digital signals and may process the digital signals. The first stereo signal STE1 may be for outputting right stereo sound, the second stereo signal STE2 may be for outputting left stereo sound, and the third stereo signal STE3 may be for outputting central stereo sound.

The digital signal processing unit 510 may include a first high-pass filter 511, a second high-pass filter 512, a stereo signal mixer 513, a low-pass filter 514, and a stereo signal modulator 515.

The first high-pass filter 511 may be a filter capable of filtering a sound signal having a first threshold frequency or higher. Thus, low-frequency sound signals having a frequency lower than the first threshold frequency may be removed. For example, the first high-pass filter 511 may lower the sound pressure of low-frequency sound signals having a frequency lower than the first threshold frequency. The first high-pass filter 511 may output a first high-frequency signal HS1 by filtering a signal in a first high-frequency range from the first stereo signal STE1. The first high-frequency signal HS1 may be a signal including right stereo sound in a high-frequency range.

The second high-pass filter 512 may be a filter capable of filtering a sound signal having a second threshold frequency or higher. Thus, low-frequency sound signals having a frequency lower than the second threshold frequency may be removed. For example, the second high-pass filter 512 may lower the sound pressure of low-frequency sound signals having a frequency lower than the second threshold frequency. The second high-pass filter 512 may output a second high-frequency signal HS2 by filtering a signal in a second high-frequency range from the second stereo signal STE2. The second threshold frequency may be substantially the same as the first threshold frequency. The second high-frequency range may be substantially the same as the first high-frequency range. The second high-frequency signal HS2 may be a signal including left stereo sound in the high-frequency range.

The stereo signal mixer 513 may receive the first and second stereo signals STE1 and STE2. The stereo signal mixer 513 may generate a mixed stereo signal MXSTE by mixing the first and second stereo signals STE1 and STE2, which may be for outputting right stereo sound and left stereo sound, respectively.

The low-pass filter 514 may be a filter may be a filter capable of filtering a sound signal having a frequency lower than a third threshold frequency. Thus, high-frequency sound signals having the third threshold frequency or higher may be removed. For example, the low-pass filter 514 may lower the sound pressure of high-frequency sound signals having the third threshold frequency or higher. The low-pass filter 514 may filter a signal in a low-frequency range from the mixed stereo signal MXSTE and may thus output a mixed low-frequency signal LS. Since the mixed stereo signal MXSTE may be generated by mixing the first and second stereo signals STE1 and STE2, the mixed low-frequency signal LS may be a signal including right stereo sound in the low-frequency range and left stereo sound in the low-frequency range. The third threshold frequency may be substantially the same as the first threshold frequency.

The first high-pass filter 511, the second high-pass filter 512, and the low-pass filter 514 may filter the first stereo signal STE1, the second stereo signal STE2, and a central stereo signal CSTE, which may be input on the basis of the same threshold frequency, and may thus output the first and second high-frequency signals HS1 and HS2, which may include sound signals in the high-frequency range, and the mixed low-frequency signal LS, which may include a sound signal in the low-frequency range. For example, dual-frequency signal processing may be performed by digitally processing sound signals in the high-frequency range and digitally processing sound signals in the low-frequency range.

The stereo signal modulator 515 may receive the mixed low-frequency signal LS in a first mode and receive the third stereo signal STE3 and the mixed low-frequency signal LS in a second mode. The first mode may be a mode for outputting 2.1 channels of stereo sound, and the second mode may be a mode for outputting 3.1 channels of stereo sound. Since in the first mode, the third stereo signal STE3 may not be received, the stereo signal modulator 515 may output the mixed low-frequency signal LS. Since in the second mode, the third stereo signal STE3 may be received, the stereo signal modulator 515 may output a modulated stereo signal MSTE by mixing the mixed low-frequency signal LS and the third stereo signal STE3.

The third stereo signal STE3 may be a signal for outputting central stereo sound in the high-frequency range and central stereo sound in the low-frequency range, and the mixed low-frequency signal LS may be a signal for outputting the right stereo sound in the low-frequency range and the left stereo sound in the low-frequency range. Accordingly, the modulated stereo signal MSTE may be a signal including not only the central stereo sound in each of the high-frequency range and the low-frequency range, but also the right stereo sound in the low-frequency range and the left stereo sound in the low-frequency range.

The digital-to-analog converter 520 may receive the first high-frequency signal HS1, the second high-frequency signal HS, and the modulated stereo signal MSTE or the mixed low-frequency signal LS. The digital-to-analog converter 520 may convert the modulated stereo signal MSTE or the mixed low-frequency signal LS, which may be a digital signal, into a first analog signal SS1', may convert the first high-frequency signal HS1, which may be a digital signal, into a second analog signal SS2', and may convert the second high-frequency signal HS2, which may be a digital signal, into a third analog signal SS3'. The digital-to-analog converter 520 may output the first, second, and third analog signals SS1', SS2', and SS3' to the amplifier 530.

The amplifier 530 may output first, second, and third sound signals SS1, SS2, and SS3 by amplifying the first, second, and third analog signals SS1', SS2', and SS3' using multiple amplifiers. Each of the multiple amplifiers may include an operational amplifier. The amplifier 530 may output the first, second, and third sound signals SS1, SS2, and SS3 to the first, second, and third sound generators 210, 220, and 230, respectively.

The first sound generator 210 may be an exciter capable of vibrating the display panel 110 by generating a magnetic force using a voice coil, as illustrated in FIGS. 7 and 8, and the second and third sound generators 220 and 230 may be piezoelectric elements or actuators capable of vibrating the display panel 110 using a piezoelectric material that may contract or expand in accordance with a voltage applied thereto, as illustrated in FIGS. 9 through 12. Exciters may output both sound in a low frequency range of less than or equal to about 800 Hz and sound in a high-frequency range of greater than or equal to about 800 Hz. Piezoelectric actuators may not output sound in the low-frequency range of less than or equal to about 800 Hz.

According to the embodiment of FIG. 13, the modulated stereo signal MSTE, which may include not only the central stereo sound in each of the high- and low-frequency ranges, but also the right stereo sound in the low-frequency range and the left stereo sound in the low-frequency range, may be converted into the first sound signal SS1, which may be an analog signal, and the first sound signal SS1 may be output to the first sound generator 210. The first high-frequency signal HS1, which may include the right stereo sound in the high-frequency range, may be converted into the second sound signal SS2, which may be an analog signal, and the second sound signal SS2 may be output to the second sound generator 220, and the second high-frequency signal HS2, which may include the left stereo sound in the high-frequency range, may be converted into the third sound signal SS3, which may be an analog signal, and the third sound signal SS3 may be output to the third sound generator 230. Accordingly, since the left stereo sound in each of the high-frequency range and the low-frequency range, the right stereo sound in each of the high-frequency range and the low-frequency range, and the central stereo sound in each of the high-frequency range and the low-frequency range can all be output, high-quality stereo sound may be provided.

According to the embodiment of FIG. 13, in the first mode, the first sound, which may be output by the vibration of the display panel 110 by the first sound generator 210, may include sound in the low-frequency range. Thus, 2.1 channels of stereo sound may be provided. In the second mode, the first sound may include both sound in the low-frequency range and sound in the high-frequency range. Thus, 3.1 channels of stereo sound may be provided by simply using only three sound generators.

Figure 14:
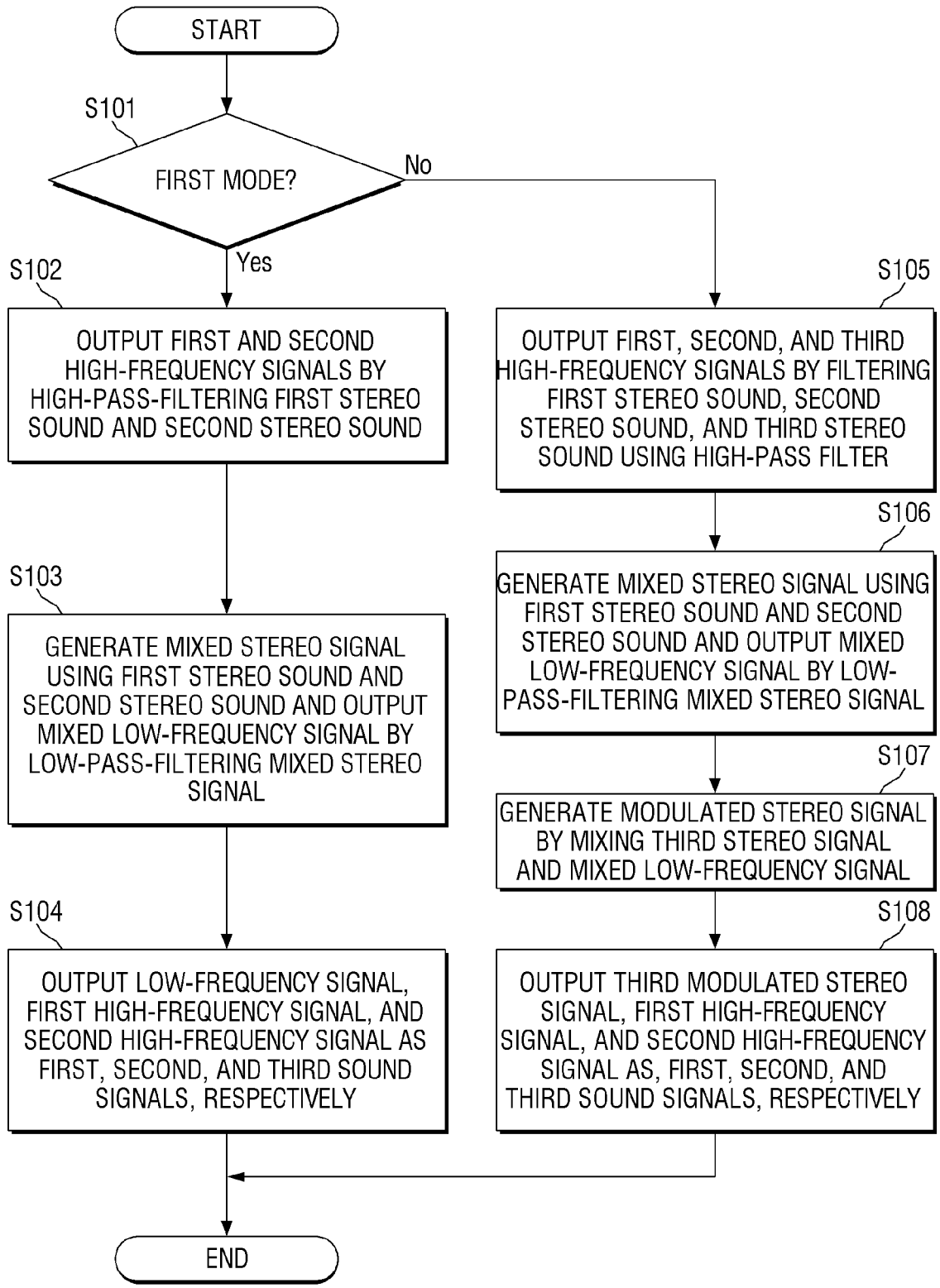
FIG. 14 shows a flowchart illustrating a sound signal output method of the sound driver of FIG. 13.

FIG. 14 shows a flowchart illustrating a sound signal output method of the sound driver of FIG. 13.

A discussion of a sound signal output method of the sound driver 171 of FIG. 13 follows below with reference to FIGS. 13 and 14.

Referring to FIGS. 13 and 14, the digital signal processing unit 510 may select one of the first and second modes (S101). The first mode may be a mode for outputting 2.1 channels of stereo sound, and the second mode may be a mode for outputting 3.1 channels of stereo sound.

The digital signal processing unit 510 may select the first mode in a case where the first and second stereo signals STE1 and STE2 may be received, and may select the second mode in a case where the first, second, and third stereo signals STE1, STE2, and STE3 may be received. For example, the digital signal processing unit 510 may select one of the first and second modes depending on whether the third stereo signal STE3 may be received.

In the first mode, the digital signal processing unit 510 may output the first high-frequency signal HS1 by filtering the first stereo sound STE1 using the first high-pass filter 511 and may output the second high-frequency signal HS2 by filtering the second stereo signal STE2 using the second high-pass filter 512 (S102).

The first high-pass filter 511 may output the first high-frequency signal HS1 by filtering a sound signal in the first high-frequency range from the first stereo signal STE1. The first high-frequency signal HS1 may be a signal including the right stereo sound in the high-frequency range.

The second high-pass filter 512 may output the second high-frequency signal HS2 by filtering a sound signal in the second high-frequency range from the second stereo signal STE2. The second high-frequency signal HS2 may be a signal including the left stereo sound in the high-frequency range.

The digital signal processing unit 510 may generate the mixed stereo signal MXSTE by mixing the first and second stereo signals STE1 and STE2 and may output the mixed low-frequency signal LS by low-pass filtering the mixed stereo signal MXSTE (S103).

The stereo signal mixer 513 may generate the mixed stereo signal MXSTE by mixing the first and second stereo signals STE1 and STE2.

The low-pass filter 514 may output the mixed low-frequency signal LS by filtering a sound signal in the low-frequency range from the mixed stereo signal MXSTE. Since the mixed stereo signal MXSTE may be generated by mixing the first and second stereo signals STE1 and STE2, the mixed low-frequency signal LS may be a signal including both the right stereo sound in the low-frequency range and the left stereo sound in the low-frequency range.

In the first mode, the sound driver 171 may convert the mixed low-frequency signal, which may be a digital signal, into the first sound signal SS1, which may be an analog signal, and may output the first sound signal SS1 to the first sound generator 210. The sound driver 171 may convert the first high-frequency signal HS1, which may be a digital signal, into the second sound signal SS2 and may output the second sound signal SS2 to the second sound generator 220. The sound driver 171 may convert the second high-frequency signal HS2, which may be a digital signal, into the third sound signal SS3 and may output the third sound signal SS3 to the third sound generator 230.

Since in the first mode, the third stereo signal STE3 may not be received, the stereo signal modulator 515 may output the mixed low-frequency signal LS.

In the first mode, the digital-to-analog converter 520 may convert the mixed low-frequency signal LS, which may be a digital signal, into the first analog signal SS1', may convert the first high-frequency signal HS1, which may be a digital signal, into the second analog signal SS2', and may convert the second high-frequency signal HS2, which may be a digital signal, into the third analog signal SS3'.

The amplifier 530 may output the first, second, and third sound signals SS1, SS2, and SS3 by amplifying the first, second, and third analog signals SS1', SS2', and SS3' using multiple amplifiers. The amplifier 530 may output the first, second, and third sound signals SS1, SS2, and SS3 to the first, second, and third sound generators 210, 220, and 230, respectively (S104).

According to S101 through S104, in the first mode, the sound driver 171 may convert the mixed low-frequency signal LS, which may include the right stereo sound in the low-frequency range and the left stereo sound in the low-frequency range, into the first sound signal SS1, which may be an analog signal, and may output the first sound signal SS1 to the first sound generator 210. Thus, first sound including low-frequency sound may be output through the vibration of the display panel 110 by the first sound generator 210. The sound driver 171 may convert the first high-frequency signal HS1, which may include the right stereo sound in the high-frequency range, into the second sound signal SS2, which may be an analog signal, and may output the second sound signal SS2 to the second sound generator 220. Thus, second sound including high-frequency sound may be output through the vibration of the display panel 110 by the second sound generator 220. The sound driver 171 may convert the second high-frequency signal HS2, which may include the left stereo sound in the high-frequency range, into the third sound signal SS3, which may be an analog signal, and may output the third sound signal SS3 to the third sound generator 230. Thus, third sound including high-frequency sound may be output through the vibration of the display panel 110 by the third sound generator 230. Accordingly, the display device 10 can provide 2.1 channels of stereo sound.

In the second mode, the digital signal processing unit 510 may output the first high-frequency signal HS1 by filtering the first stereo signal STE1 using the first high-pass filter 511 and may output the second high-frequency signal HS2 by filtering the second stereo signal STE2 using the second high-pass filter 512 (S105).

In the second mode, the digital signal processing unit 510 may generate the mixed stereo signal MXSTE by mixing the first and second stereo signals STE1 and STE2 using the stereo signal mixer 513 and may output the mixed low-frequency signal LS by filtering the mixed stereo signal MXSTE using the low-pass filter 514 (S106).

S105 and S106 are substantially the same as S102 and S103, respectively, and thus, detailed descriptions thereof will be omitted.

In the second mode, the digital signal processing unit 510 may generate the mixed stereo signal MSTE by mixing the third stereo signal STE3 and the mixed low-frequency signal LS (S107).

In the second mode, the stereo signal modulator 515 may output the modulated stereo signal MSTE by mixing the third stereo signal STE3 and the mixed low-frequency signal LS. The third stereo signal STE3 may be a signal for outputting the central stereo sound in the low-frequency range, and the mixed low-frequency signal LS may be a signal for outputting the right stereo sound in the low-frequency range and the left stereo sound in the low-frequency range. Accordingly, the modulated stereo signal MSTE may be a signal including not only the central stereo sound in each of the high-frequency range and the low-frequency range, but also the right stereo sound in the low-frequency range and the left stereo sound in the low-frequency range.

In the second mode, the sound driver 171 may convert the modulated stereo signal MSTE, which may be a digital signal, into the first sound signal SS1, which may be an analog signal, and may output the first sound signal SS1 to the first sound generator 210. The sound driver 171 may convert the first high-frequency signal HS1, which may be a digital signal, into the second sound signal SS2, which may be an analog signal, and may output the second sound signal SS2 to the second sound generator 220. The sound driver 171 may convert the second high-frequency signal HS2, which may be a digital signal, into the third sound signal SS3, which may be an analog signal, and may output the third sound signal SS3 to the third sound generator 230.

Since in the second mode, the third stereo signal STE3 may be received, the stereo signal modulator 515 may output the modulated stereo signal MSTE by mixing the third stereo signal STE3 and the mixed low-frequency signal LS.

In the second mode, the digital-to-analog converter 520 may convert the modulated stereo signal MSTE, which may be a digital signal, into the first analog signal SS1', may convert the first high-frequency signal HS1, which may be a digital signal, into the second analog signal SS2', and may convert the second high-frequency signal HS2, which may be a digital signal, into the third analog signal SS3'.

The amplifier 530 may output the first, second, and third sound signals SS1, SS2, and SS3 by amplifying the first, second, and third analog signals SS1', SS2', and SS3' using multiple amplifiers. The amplifier 530 may output the first, second, and third sound signals SS1, SS2, and SS3 to the first, second, and third sound generators 210, 220, and 230, respectively (S108).

According to S105 through S108, in the second mode, the sound driver 171 may convert the modulated stereo signal MSTE, which may include not only the central stereo sound in each of the high-frequency range and the low-frequency range, but also the right stereo sound in the low-frequency range and the left stereo sound in the low-frequency range, into the first sound signal SS1, which may be an analog signal, and may output the first sound signal SS1 to the first sound generator 210. Thus, first sound including low-frequency sound may be output through the vibration of the display panel 110 by the first sound generator 210. The sound driver 171 may convert the first high-frequency signal HS1, which may include the right stereo sound in the high-frequency range, into the second sound signal SS2, which may be an analog signal, and may output the second sound signal SS2 to the second sound generator 220. Thus, second sound including high-frequency sound may be output through the vibration of the display panel 110 by the second sound generator 220. The sound driver 171 may convert the second high-frequency signal HS2, which may include the left stereo sound in the high-frequency range, into the third sound signal SS3, which may be an analog signal, and may output the third sound signal SS3 to the third sound generator 230. Thus, third sound including high-frequency sound may be output through the vibration of the display panel 110 by the third sound generator 230. Accordingly, since the left stereo sound in each of the low-frequency range and the high-frequency range, the right stereo sound in each of the low-frequency range and the high-frequency range, and the central stereo sound in each of the low-frequency range and the high-frequency range may all be output, high-quality stereo sound may be provided. Since the first sound generator 210 may output both high-frequency and low-frequency sound, 3.1 channels of stereo sound may be output simply by using only three sound generators.

Figure 15:
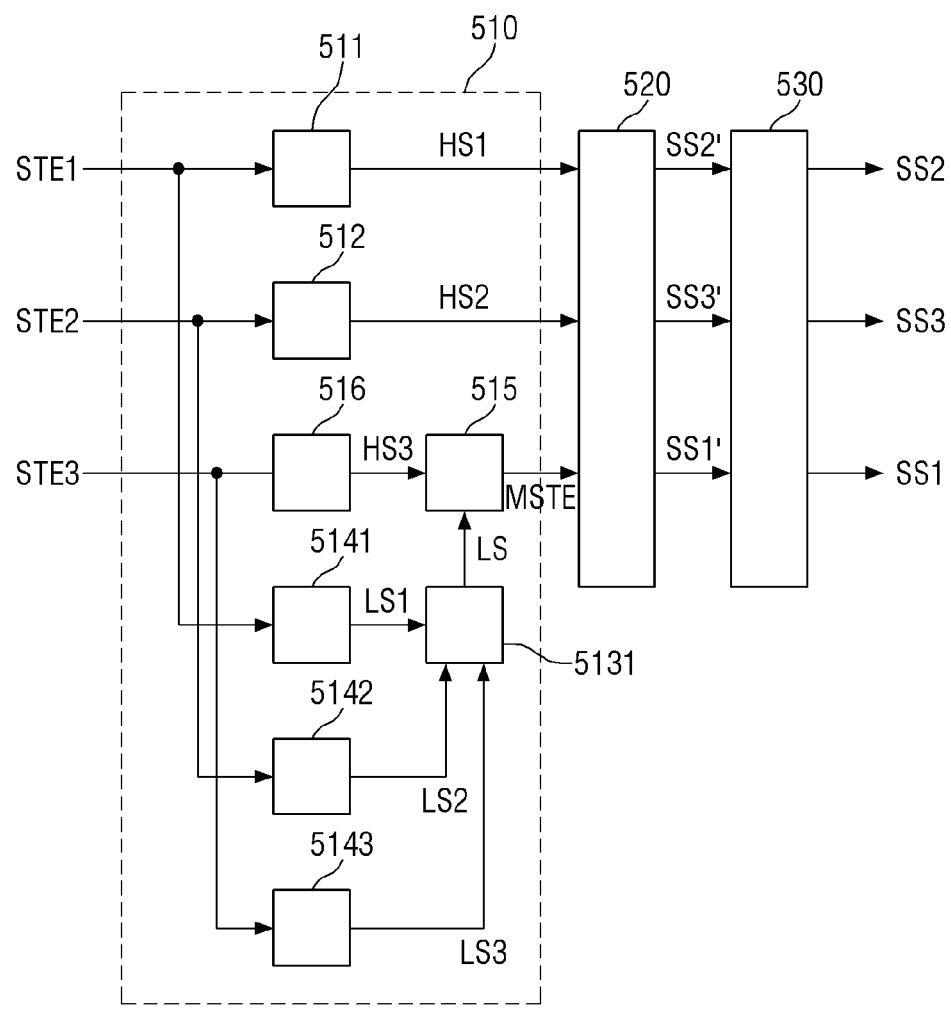
FIG. 15 shows a block diagram illustrating a sound driver according to another embodiment of the disclosure.

FIG. 15 shows a block diagram illustrating a sound driver according to another embodiment of the disclosure.

A sound driver 171 of FIG. 15 may differ from the sound driver 171 of FIG. 13 in that a digital signal processing unit 510 may further include a third high-pass filter 516, a first low-pass filter 5141, a second low-pass filter 5142, and a third low-pass filter 5143.

Referring to FIG. 15, the digital signal processing unit 510 may include a first high-pass filter 511, a second high-pass filter 512, a low-frequency signal mixer 2231, the first low-pass filter 5141, the second low-pass filter 5142, the third low-pass filter 5143, a stereo signal modulator 515, and the third high-pass filter 516.

The first and second high-pass filters 511 and 512 may be substantially the same as their respective counterparts of FIG. 13, and thus, detailed descriptions thereof will be omitted.

The third high-pass filter 516 may be a filter capable of filtering a sound signal having a fourth threshold frequency or higher. Thus, low-frequency sound signals having a frequency lower than the fourth threshold frequency may be removed. For example, the third high-pass filter 516 may lower the sound pressure of low-frequency sound signals having a frequency lower than the fourth threshold frequency. The third high-pass filter 516 may output a third high-frequency signal HS3 by filtering a signal in a third high-frequency range from a third stereo signal STE3. The fourth threshold frequency may be substantially the same as a first threshold frequency. The third high-frequency range may be substantially the same as a first high-frequency range. The third high-frequency signal HS3 may be a signal including central stereo sound in a high-frequency range.

Each of the first, second, and third low-pass filters 5141, 5142, and 5143 may be a filter capable of filtering a sound signal having a frequency lower than the third threshold frequency, and as a result, a high-frequency sound signal having the third threshold frequency or higher may be removed. For example, each of the first, second, and third low-pass filters 5141, 5142, and 5143 may lower the sound pressure of high-frequency sound signals having the third threshold frequency or higher.

The first low-pass filter 5141 may output a first low-frequency signal LS1 by filtering a sound signal in a low-frequency range from a first stereo signal STE1. The first low-frequency signal LS1 may be a signal including right stereo sound in the low-frequency range. The third threshold frequency may be substantially the same as the first threshold frequency.

The second low-pass filter 5142 may output a second low-frequency signal LS2 by filtering a sound signal in the low-frequency range from a second stereo signal STE2. The second low-frequency signal LS2 may be a signal including left stereo sound in the low-frequency range.

The third low-pass filter 5143 may output a third low-frequency signal LS3 by filtering a sound signal in the low-frequency range from the third stereo signal STE3. The third low-frequency signal LS3 may be a signal including central stereo sound in the low-frequency range.

The low-frequency signal mixer 2231 may receive the first and second low-frequency signals LS1 and LS2 in a first mode and may receive the first, second, and third low-frequency signals LS1, LS2, and LS3 in a second mode. In the first mode, the low-frequency signal mixer 2231 may generate a mixed low-frequency signal LS by mixing the first and second low-frequency signals LS1 and LS2. In the second mode, the low-frequency signal mixer 2231 may generate the mixed low-frequency signal LS by mixing the first, second, and third low-frequency signals LS1, LS2, and LS3.

The stereo signal modulator 515 may receive the mixed low-frequency signal LS in the first mode and may receive the third high-frequency signal HS3 and the mixed low-frequency signal LS in the second mode. The first mode may be a mode for outputting 2.1 channels of stereo sound, and the second mode may be a mode for outputting 3.1 channels of stereo sound. Since in the first mode, the third high-frequency signal HS3 may not be received, the stereo signal modulator 515 may output the mixed low-frequency signal LS. Since in the second mode, the third high-frequency signal HS3 may be received, the stereo signal modulator 515 may output a modulated stereo signal MSTE by mixing the third high-frequency signal HS3 and the mixed low-frequency signal LS.

The third high-frequency signal HS3 may be a signal including the central stereo sound in the high-frequency range, and the mixed low-frequency signal LS may be a signal including the right stereo sound in the low-frequency range, the left stereo sound in the low-frequency range, and the central stereo sound in the low-frequency range. Accordingly, the modulated stereo signal MSTE may be a signal including not only the central stereo sound in each of the high-frequency range and the low-frequency range, but also the right stereo sound in the low-frequency range and the left stereo sound in the low-frequency range.

A digital-to-analog converter 520 and an amplifier 530 may be substantially the same as their respective counterparts of FIG. 13, and thus, detailed descriptions thereof will be omitted.

Figure 16:
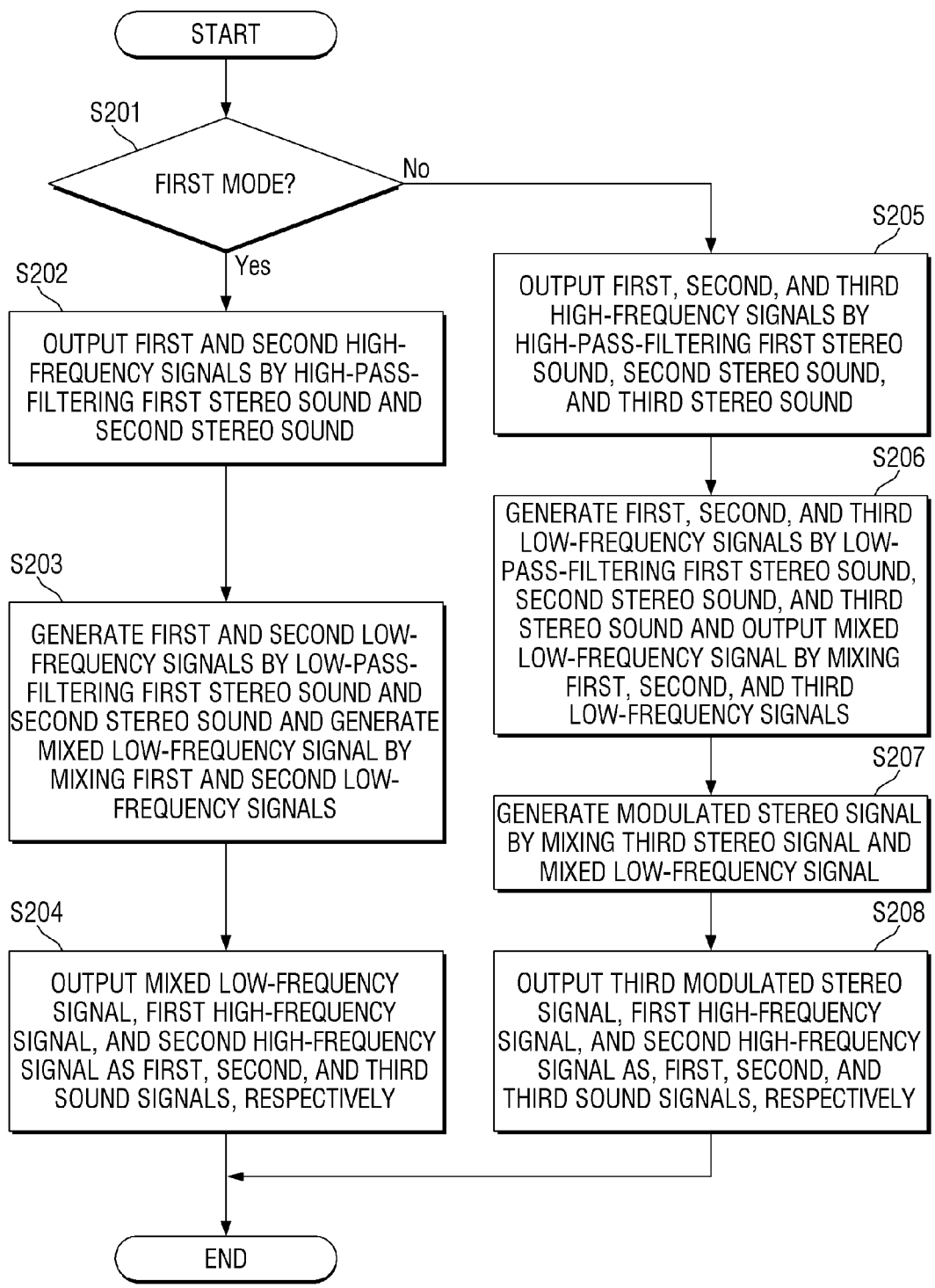
FIG. 16 shows a flowchart illustrating a sound signal output method of the sound driver of FIG. 15.

FIG. 16 shows a flowchart illustrating a sound signal output method of the sound driver of FIG. 15.

A discussion of a sound signal output method of the sound driver 171 of FIG. 15 follows below with reference to FIGS. 15 and 16.

Referring to FIGS. 15 and 16, the digital signal processing unit 510 may select one of the first and second modes (S201). The first mode may be a mode for outputting 2.1 channels of stereo sound, and the second mode may be a mode for outputting 3.1 channels of stereo sound.

In the first mode, the digital signal processing unit 510 may output the first high-frequency signal HS1 by filtering the first stereo sound STE1 using the first high-pass filter 511 and may output the second high-frequency signal HS2 by filtering the second stereo signal STE2 using the second high-pass filter 512 (S202).

S201 and S202 may be substantially the same as S101 and S102, respectively, of FIG. 14, and thus, detailed descriptions thereof will be omitted.

Thereafter, in the first mode, the digital signal processing unit 510 may output the first low-frequency signal LS1 by filtering the first stereo signal STE1 using the first low-pass filter 5141 and may output the second low-frequency signal LS2 by filtering the second stereo signal STE2 using the second low-pass filter 5142. The digital signal processing unit 510 may generate the mixed low-frequency signal LS by mixing the first and second low-frequency signals LS1 and LS2 (S203).

The first low-pass filter 5141 may output the first low-frequency signal LS1 by filtering a sound signal in the low-frequency range from the first stereo signal STE1. The first low-frequency signal may be a signal including the right stereo sound in the low-frequency range.

The second low-pass filter 5142 may output the second low-frequency signal LS2 by filtering a sound signal in the low-frequency range from the second stereo signal STE2. The second low-frequency signal LS2 may be a signal including the left stereo sound in the low-frequency range.

In the first mode, the low-frequency signal mixer 2231 may generate the mixed low-frequency signal LS by mixing the first and second low-frequency signals LS1 and LS2. The mixed low-frequency signal LS may be a signal including the right stereo sound in the low-frequency range, the left stereo sound in the low-frequency range, and the central stereo sound in the low-frequency range.

The sound driver 171 may convert the mixed low-frequency signal LS, which may be a digital signal, into the first sound signal SS1, which may be an analog signal, and may output the first sound signal SS1 to the first sound generator 210. The sound driver 171 may convert the first high-frequency signal HS1, which may be a digital signal, into the second sound signal SS2, which may be an analog signal, and may output the second sound signal SS2 to the second sound generator 220. The sound driver 171 may convert the second high-frequency signal HS2, which may be a digital signal, into the third sound signal SS3, which may be an analog signal, and may output the third sound signal SS3 to the third sound generator 230 (S204).

S204 may be substantially the same as S104 of FIG. 14, and thus, a detailed description thereof will be omitted.

In the second mode, the digital signal processing unit 510 may output the first high-frequency signal HS1 by filtering the first stereo signal STE1 using the first high-pass filter 511, may output the second high-frequency signal HS2 by filtering the second stereo signal STE2 using the second high-pass filter 512, and may output the third high-frequency signal HS3 by filtering the third stereo signal STE3 using the third high-pass filter 516 (S205).

The output of the first and second high-frequency signals HS1 and HS2 in the second mode in S205 may be substantially the same as the output of the first and second high-frequency signals HS1 and HS2 in the first mode in S202, and thus, a detailed description thereof will be omitted.

The third high-pass filter 516 may output the third high-frequency signal HS3 by filtering a sound signal in the third high-frequency range from the third stereo signal STE3. The third high-frequency signal HS3 may be a signal including the central stereo sound in the high-frequency range.

In the second mode, the digital signal processing unit 510 may output the first low-frequency signal LS1 by filtering the first stereo signal STE1 using the first low-pass filter 5141, may output the second low-frequency signal LS2 by filtering the second stereo signal STE2 using the second low-pass filter 5142, and may output the third low-frequency signal LS3 by filtering the third stereo signal STE3 using the third low-pass filter 5143. The digital signal processing unit 510 may generate the mixed low-frequency signal LS by mixing the first, second, and third low-frequency signals LS1, LS2, and LS3 (S206).

The output of the first and second low-frequency signals LS1 and LS2 in the second mode in S206 may be substantially the same as the output of the first and second low-frequency signals LS1 and LS2 in the first mode in S203, and thus, a detailed description thereof will be omitted.

The third low-pass filter 5143 may output the third low-frequency signal LS3 by filtering a sound signal in the low-frequency range from the third stereo signal STE3. The third low-frequency signal LS3 may be a signal including the central stereo sound in the low-frequency range.

In the second mode, the low-frequency signal mixer 2231 may generate the mixed low-frequency signal LS by mixing the first, second, and third low-frequency signals LS1, LS2, and LS3. The mixed low-frequency signal LS may be a signal including the right stereo sound in the low-frequency range, the left stereo sound in the low-frequency range, and the central stereo sound in the low-frequency range.

In the second mode, the digital signal processing unit 510 may generate the modulated stereo signal MSTE by mixing the third high-frequency signal HS3 and the mixed low-frequency signal LS (S207).

In the second mode, the stereo signal modulator 515 may output the modulated stereo signal MSTE by mixing the third high-frequency signal HS3 and the mixed low-frequency signal LS. The third high-frequency signal HS3 may be a signal for outputting the central stereo sound in the high-frequency range, and the mixed low-frequency signal LS may be a signal including the right stereo sound in the low-frequency range, the left stereo sound in the low-frequency range, and the central stereo sound in the low-frequency range. Accordingly, the modulated stereo signal MSTE may be a signal including not only the central stereo sound in each of the high-frequency range and the low-frequency range, but also the right stereo sound in the low-frequency range and the left stereo sound in the low-frequency range.

In the second mode, the sound driver 171 may convert the modulated stereo signal MSTE, which may be a digital signal, into the first sound signal SS1, which may be an analog signal, and may output the first sound signal SS1 to the first sound generator 210. The sound driver 171 may convert the first high-frequency signal HS1, which may be a digital signal, into the second sound signal SS2, which may be an analog signal, and may output the second sound signal SS2 to the second sound generator 220. The sound driver 171 may convert the second high-frequency signal HS2, which may be a digital signal, into the third sound signal SS3, which may be an analog signal, and may output the third sound signal SS3 to the third sound generator 230 (S208).

S208 may be substantially the same as S108 of FIG. 14, and thus, a detailed description thereof will be omitted.

According to S205 through S208, in the second mode, the sound driver 171 may convert the modulated stereo signal MSTE, which may include not only the central stereo sound in each of the high-frequency range and the low-frequency range, but also the right stereo sound in the low-frequency range and the left stereo sound in the low-frequency range, into the first sound signal SS1, which may be an analog signal, and may output the first sound signal SS1 to the first sound generator 210. Thus, first sound including low-frequency sound may be output through the vibration of the display panel 110 by the first sound generator 210. The sound driver 171 may convert the first high-frequency signal HS1, which may include the right stereo sound in the high-frequency range, into the second sound signal SS2, which may be an analog signal, and may output the second sound signal SS2 to the second sound generator 220. Thus, second sound including high-frequency sound may be output through the vibration of the display panel 110 by the second sound generator 220. The sound driver 171 may convert the second high-frequency signal HS2, which may include the left stereo sound in the high-frequency range, into the third sound signal SS3, which may be an analog signal, and may output the third sound signal SS3 to the third sound generator 230 Thus, third sound including high-frequency sound may be output through the vibration of the display panel 110 by the third sound generator 230. Accordingly, since the left stereo sound in each of the low-frequency range and the high-frequency range, the right stereo sound in each of the low-frequency range and the high-frequency range, and the central stereo sound in each of the low-frequency range and the high-frequency range may all be output, high-quality stereo sound may be provided. Since the first sound generator 210 may output both high-frequency sound and low-frequency sound, 3.1 channels of stereo sound may be output simply by using only three sound generators.

Figure 17:
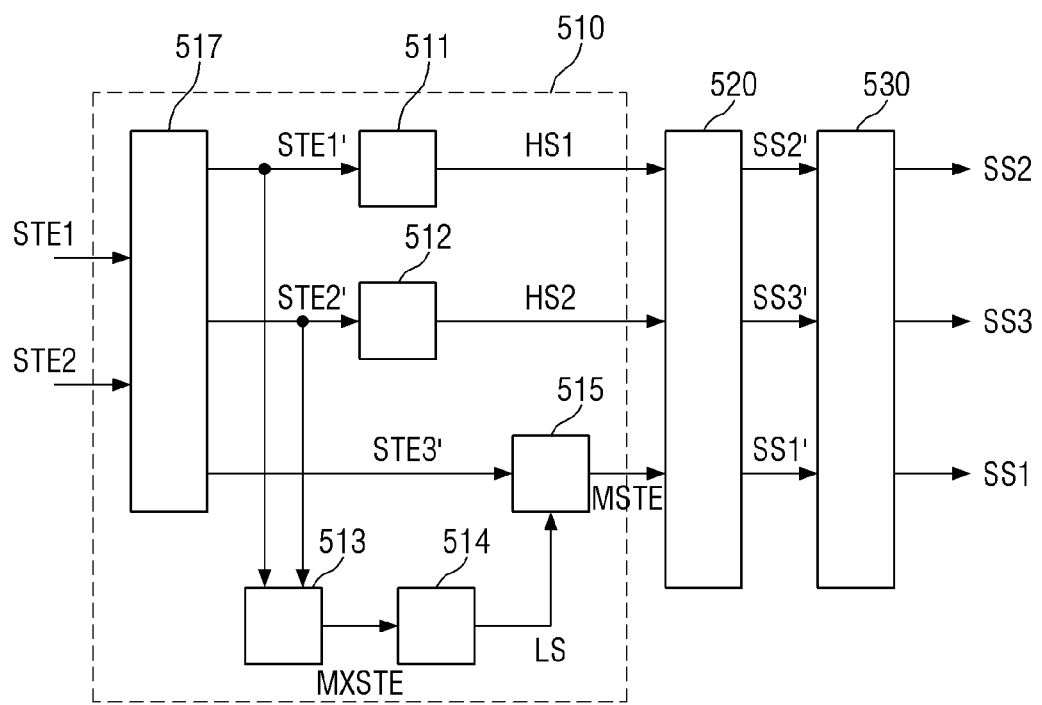
FIG. 17 shows a block diagram illustrating a sound driver according to another embodiment of the disclosure.

FIG. 17 shows a block diagram illustrating a sound driver according to another embodiment of the disclosure.

A sound driver 171 of FIG. 17 may differ from the sound driver 171 of FIG. 13 in that a digital signal processing unit 510 may further include a stereo signal generator 517.

Referring to FIG. 17, the digital signal processing unit 510 may include a first high-pass filter 511, a second high-pass filter 12, a stereo signal mixer 513, a low-pass filter 514, a stereo signal modulator 515, and the stereo signal generator 517.

The stereo signal generator 517 may receive first and second stereo signals STE1 and STE2. The first stereo signal STE1 may be a right stereo signal, and the second stereo signal STE2 may be a left stereo signal. In a first mode, the stereo signal generator 517 may output first and second stereo signals STE1' and STE2' using the first and second stereo signals STE1 and STE2 without converting the first and second stereo signals STE1 and STE2.

In a second mode, the stereo signal generator 517 may generate first, second, and third stereo signals STE1', STE2', and STE3' using the first and second stereo signals STE1 and STE2. The first stereo signal STE1' may be a right stereo signal, the second stereo signal STE2' may be a left stereo signal, and the third stereo signal STE3' may be a central stereo signal. For example, in the second mode, the stereo signal generator 517 may generate left, right, and central stereo signals using left and right stereo signals.

Figure 18:
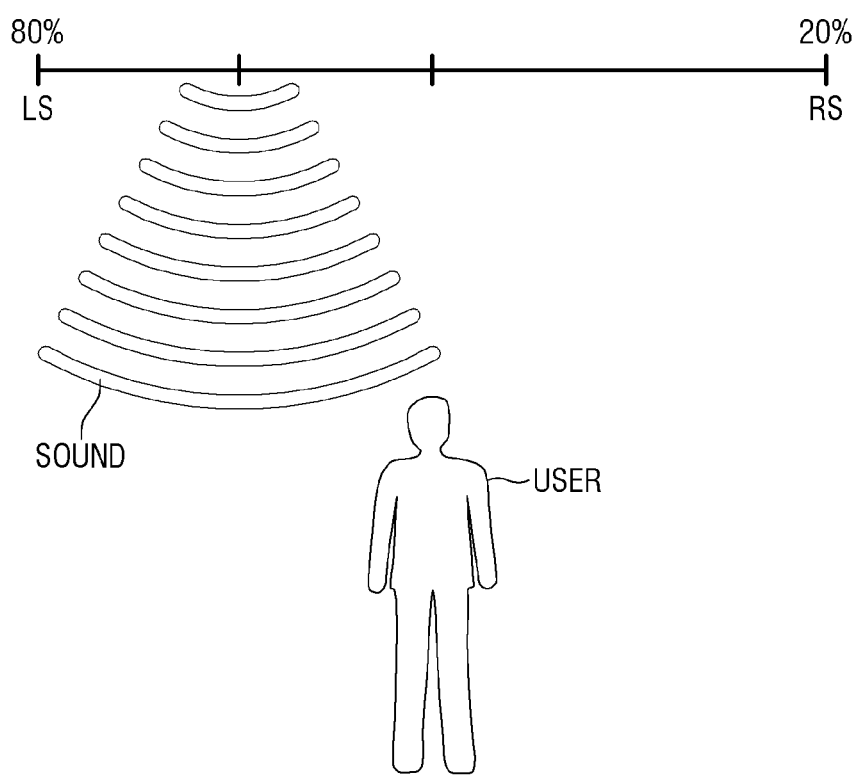
FIG. 18 shows what percentage of stereo sound each of left sound and right sound accounts for in a first mode.

Referring to FIG. 18, the ratio of second sound RS which may be output by the vibration of the display panel 110 by the second sound generator 220, which may be disposed on the right side of the display panel 110, in accordance with the first stereo signal STE1 and third sound LS which may be output by the vibration of the display panel 110 by the third sound generator 230, which may be disposed on the left side of the display panel 110, in accordance with the second stereo signal STE2 may be about 20:80. Thus, according to the ratio, the user may feel as if sound may be generated in an area near the second sound generator 220.

Figure 19:
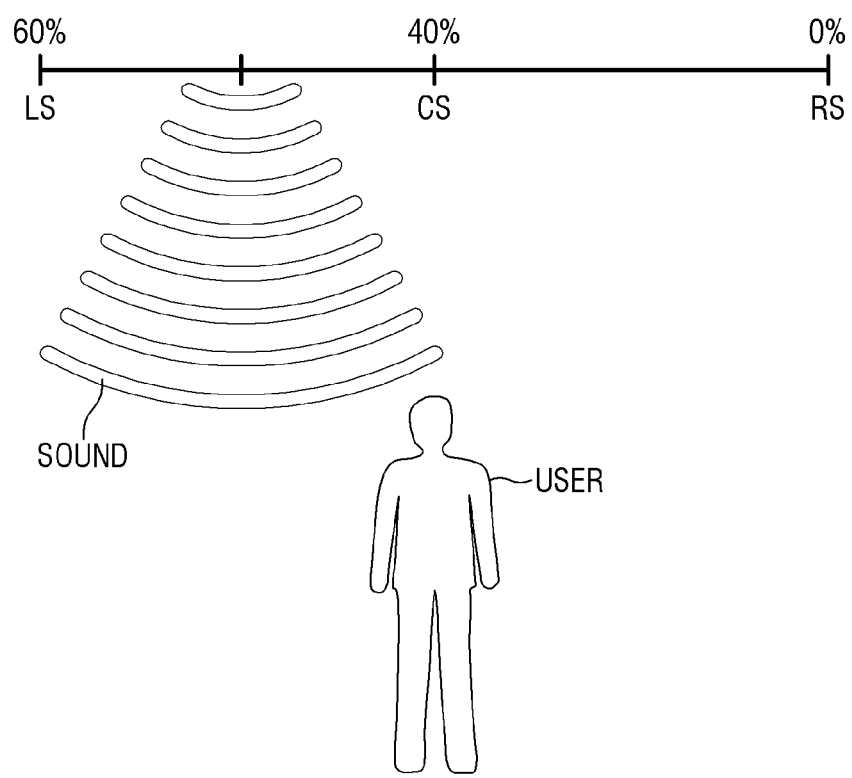
FIG. 19 shows what percentage of stereo sound each of left sound, right sound, and central sound accounts for in a second mode.

The stereo signal generator 517 may generate the first, second, and third stereo signals STE1', STE2', and STE3' using the first and second stereo signals STE1 and STE2 so that the user may feel as if sound may be generated at substantially the same locations. Referring to FIG. 19, the ratio of first sound CS which may be output by the vibration of the display panel 110 by the first sound generator 110, which may be disposed at the center of the display panel 110, in accordance with the third stereo signal STE3', second sound RS which may be output by the vibration of the display panel 110 by the second sound generator 220, which may be disposed on the right side of the display panel 110, in accordance with the first stereo signal STE1', and third sound LS which may be output by the vibration of the display panel 110 by the third sound generator 230, which may be disposed on the left side of the display panel 110, in accordance with the second stereo signal STE2' may be about 40:0:60.

The first high-pass filter 511, the second high-pass filter 512, the stereo signal mixer 513, the low-pass filter 514, and the stereo signal modulator 515 may be substantially the same as their respective counterparts of FIG. 13 except that the first, second, and third stereo signals STE1, STE2, and STE3 may be replaced with first, second, and third modulated stereo signals MSTE1, MSTE2, and MSTE3, respectively, and thus, detailed descriptions thereof will be omitted.

Figure 20:
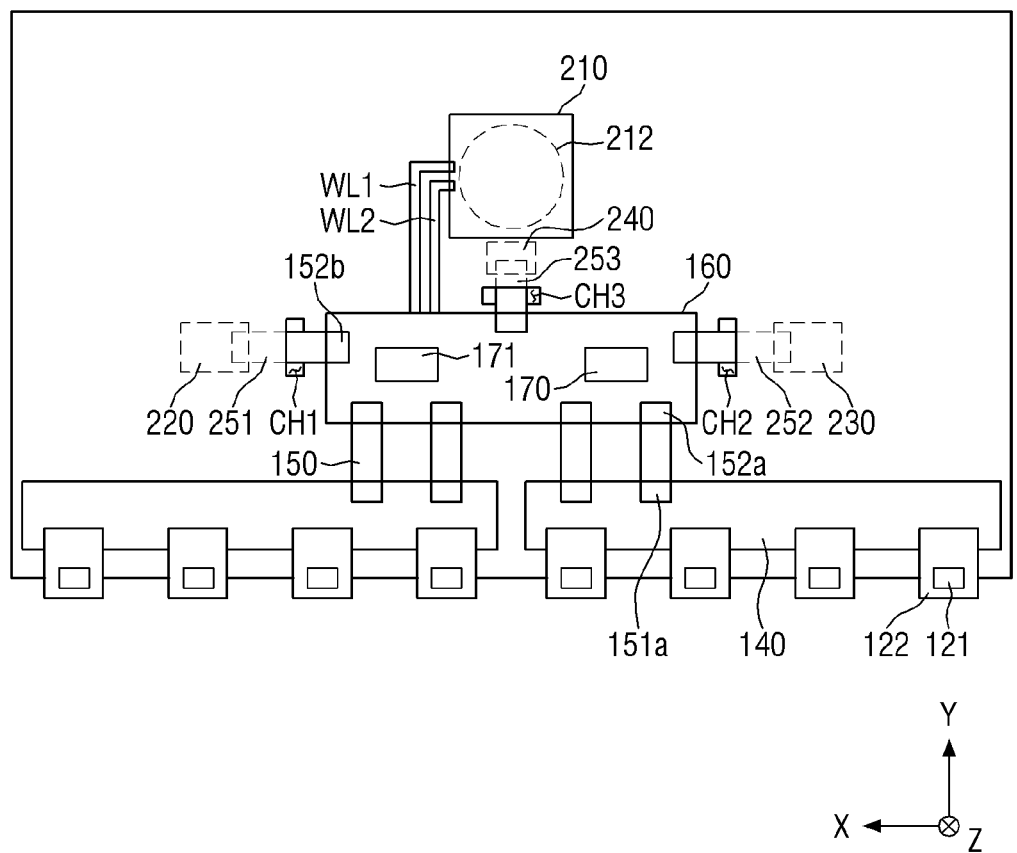
FIG. 20 shows a bottom view of a display device according to another embodiment of the disclosure.

FIG. 20 shows a bottom view of a display device according to another embodiment of the disclosure.

A display device 10 of FIG. 20 may differ from the display device 10 of FIG. 3 in that it may further include a fourth sound generator 240.

Referring to FIG. 20, the fourth sound generator 240 may be disposed on a second surface of a first substrate 111. The fourth sound generator 240 may be a vibration device capable of vibrating a display panel 110 in a third direction (or the Z-axis direction) in accordance with a fourth sound signal. For example, the fourth sound generator 240 may be a piezoelectric element or a piezoelectric actuator capable of vibrating the display panel 110 using a piezoelectric material that may contract or may expand in accordance with a voltage applied thereto, as illustrated in FIGS. 9 through 12.

In a case where a first sound generator 210 may be implemented as an exciter capable of vibrating the display panel 110 by generating a magnetic force using a voice coil, as illustrated in FIGS. 7 and 8, the sound pressure of high-frequency first sound output by the vibration of the display panel 110 by the first sound generator 110 may be lower than the sound pressure of sound generated by a second or third sound generator 220 or 230 which may be implemented as a piezoelectric element or a piezoelectric actuator. Thus, to reinforce the sound pressure of the first sound, the fourth sound generator 240, which may be implemented as a piezoelectric element or a piezoelectric actuator, may be disposed adjacent to the first sound generator 210. For example, the distance between the first and fourth sound generators 210 and 240 may be smaller than the distance between the second and fourth sound generators 220 and 240, and the distance between the first and fourth sound generators 210 and 240 may be smaller than the distance between the third and fourth sound generators 230 and 240.

Figure 21:
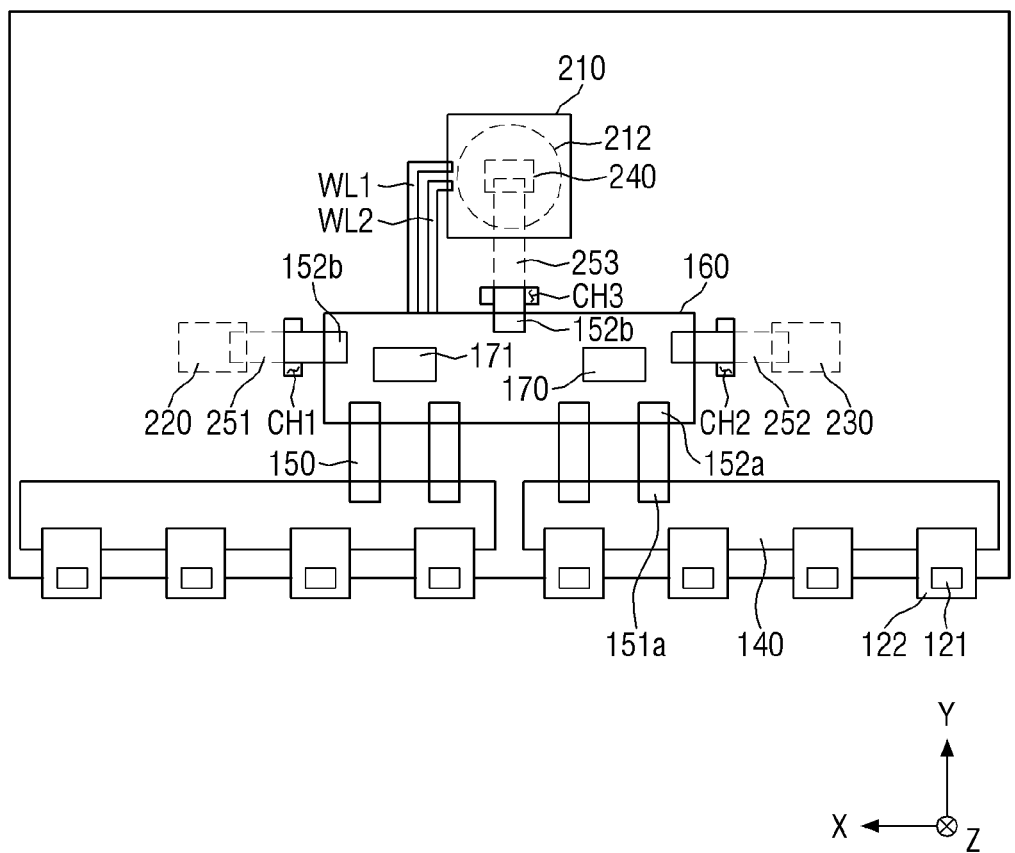
FIG. 21 shows a bottom view of a display device according to another embodiment of the disclosure.

As another example, as illustrated in FIG. 21, the fourth sound generator 240 may be disposed on the inside of a bobbin 212 of the first sound generator 210. The fourth sound generator 240 may be surrounded by the bobbin 212 of the first sound generator 210. In other words, the bobbin 212 of the first sound generator 210 may be around the fourth sound generator 240.

Figure 22:
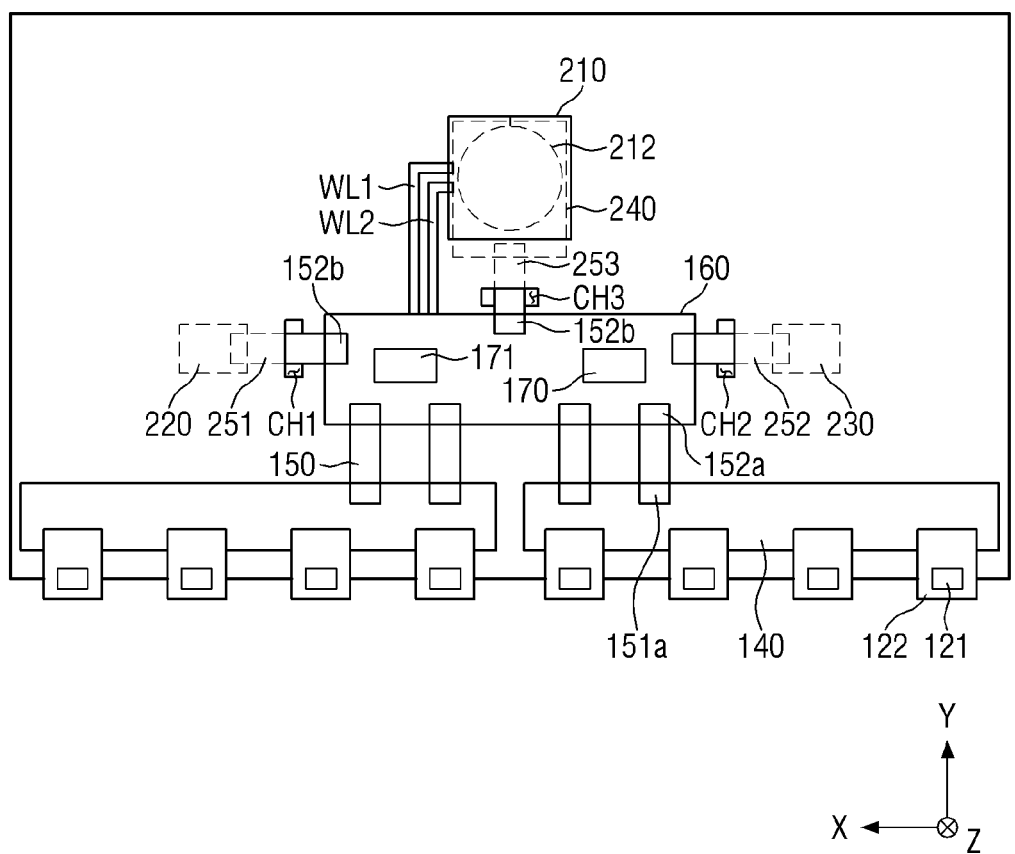
FIG. 22 shows a bottom view of a display device according to another embodiment of the disclosure.

As still another example, as illustrated in FIG. 22, the fourth sound generator 240 may be disposed on a first surface of a heat dissipation film 130, and the bobbin 212 of the first sound generator 210 may be disposed on a first surface of the fourth sound generator 240. For example, the bobbin 212 of the first sound generator 210 and the fourth sound generator 240 may be disposed to overlap with or face each other in the third direction (or the Z-axis direction).

According to the embodiments of FIGS. 20 through 22, the first and second sound generators 210 and 240 may output sound by vibrating the same part of the display panel 110 at the same time. Accordingly, the first and fourth sound generators 210 and 240 may vibrate the display panel 110 while dividing the range of sound frequencies. For example, the first sound generator 210 may vibrate the display panel 110 to output sound in a low-frequency range, and the fourth sound generator 240 may vibrate the display panel 110 to output sound in a high-frequency range. Accordingly, first sound output by the vibration of the display panel by the first and fourth sound generators 210 and 240 may have both the low-frequency range and the high-frequency range, and as a result, high-quality sound may be provided.

Since the fourth sound generator 240 may reinforce the sound pressure of first sound in the high-frequency range, the size of the fourth sound generator 240 may be smaller than the size of the second or third sound generator 220 or 230, as illustrated in FIGS. 20 and 21. For example, the length, in a first direction (or an X-axis direction), of the fourth sound generator 240 may be smaller than the length, in the first direction (or the X-axis direction), of the second sound generator 220. The length, in a second direction (or a Y-axis direction), of the fourth sound generator 240 may be smaller than the length, in the second direction (or the Y-axis direction), of the second sound generator 220. The length, in the third direction (or the Z-axis direction), of the fourth sound generator 240 may be smaller than the length, in the third direction (or the Z-axis direction), of the second sound generator 220. For example, the area of the fourth sound generator 240 may be smaller than the area of the second sound generator 220. For example, the length, in the first direction (or the X-axis direction), of the fourth sound generator 240 may be smaller than the length, in the first direction (or the X-axis direction), of the third sound generator 230. The length, in the second direction (or the Y-axis direction), of the fourth sound generator 240 may be smaller than the length, in the second direction (or the Y-axis direction), of the third sound generator 230. The length, in the third direction (or the Z-axis direction), of the fourth sound generator 240 may be smaller than the length, the third direction (or the Z-axis direction), of the third sound generator 230. For example, the area of the fourth sound generator 240 may be smaller than the area of the third sound generator 230.

Figure 23:
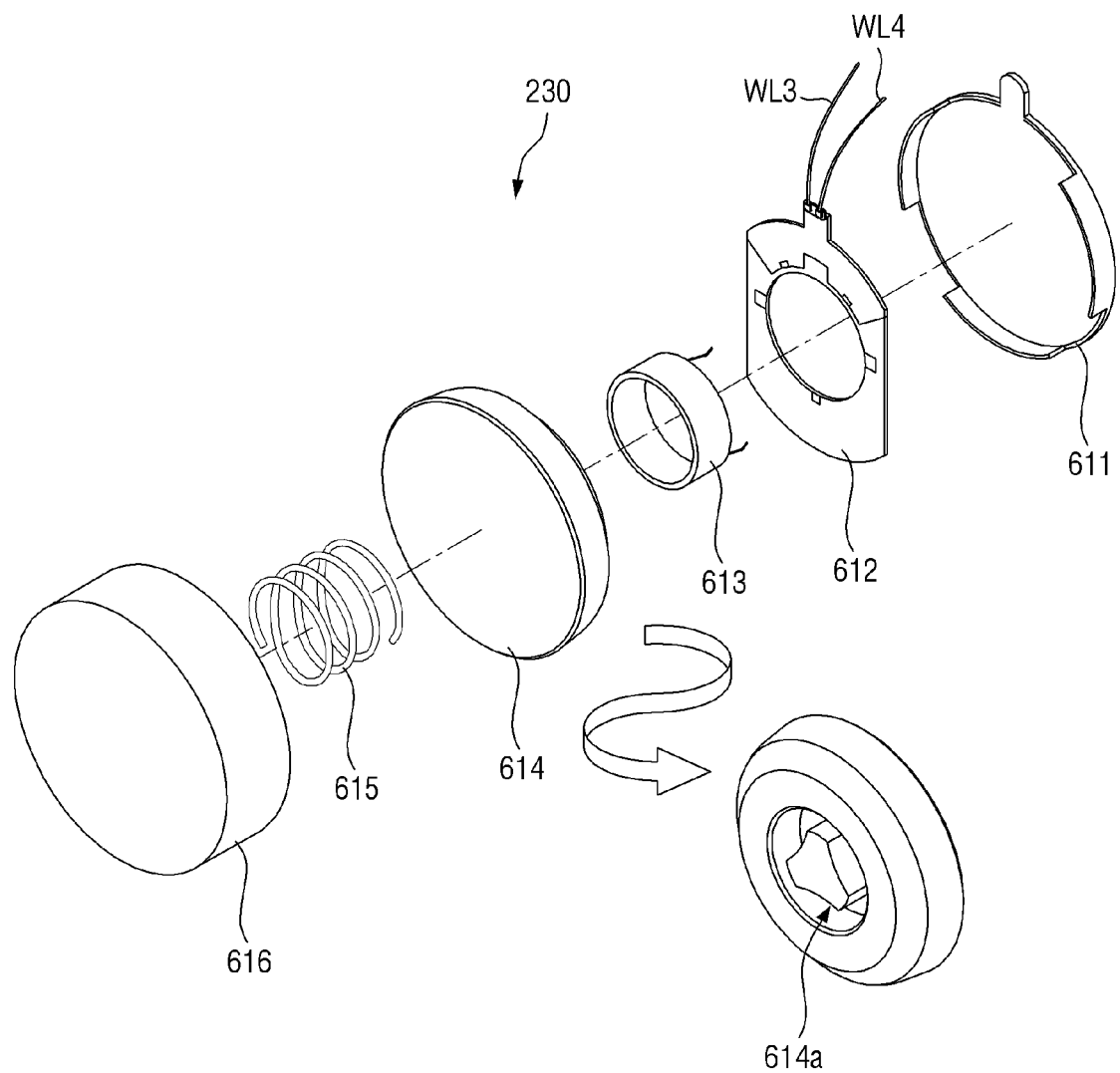
FIG. 23 shows an exploded perspective view of a first sound generator of FIG. 22.

The first sound generator 210 may be implemented not only as an exciter capable of vibrating the display panel 110 by generating a magnetic force using a voice coil, as illustrated in FIGS. 7 and 8, but also as a linear resonant actuator (LRA), as illustrated in FIG. 23. In a case where the first sound generator 210 may be implemented as an LRA, the first sound generator 210 may include a lower chassis 611, an FPCB 612, a second voice coil 613, a second magnet 614, a spring 615, and an upper chassis 616. The lower and upper chassis 611 and 616 may be formed of a metallic material. The FPCB 612 may be disposed on a first surface of the lower chassis 611 that faces the upper chassis 616 and may be connected to third and fourth sound wires WL1 and WL3. The second voice coil 613 may be connected to a first surface of the FPCB 612 that faces the upper chassis 616. Accordingly, one end of the second voice coil 613 may be electrically connected to the first sound wire WL1, and the other end of the second voice coil 613 may be electrically connected to the second sound wire WL2. The second magnet 614 may be a permanent magnet, and a voice coil groove 641, in which the second voice coil 613 may be received, may be formed on a surface of the second magnet 614 that faces the second voice coil 613. The spring 615 may be disposed between the second magnet 614 and the upper chassis 616.

The direction of a current that flows in the second voice coil 613 of the first sound generator 210 may be controlled in accordance with "4A" and "4B" driving voltages of a fourth sound signal, which may be applied to the third and fourth sound wires WL3 and WL4, respectively. An applied magnetic field may be formed around the second voice coil 613 depending on the current that may flow in the second voice coil 613. For example, the direction of the current that may flow in the second voice coil 613, in a case that the "4A" driving voltage may be a positive voltage and the "4B" driving voltage may be a negative voltage, may be opposite to the direction of the current that may flow in the second voice coil 613 in a case that the "4A" driving voltage may be a negative voltage and the "4B" driving voltage may be a positive voltage. Since the "4A" and "4B" driving voltages may be alternately driven, an attracting force and a repulsive force may be acted upon the second magnet 614 and the second voice coil 613 so that the second magnet 614 may reciprocate between the second voice coil 613 and the upper chassis 616 due to force of the spring 615. Accordingly, a vibrating surface disposed on the upper chassis 616, i.e., the display panel 110, may vibrate, and as a result, sound may be output. The upper chassis 616 may be the closest surface to the display panel 110.

According to the embodiment of FIGS. 20 through 22, since the first sound output by the vibration of the display panel 110 by the first sound generator 210 in the first mode may include sound in the low-frequency range, 2.1 channels of stereo sound may be provided. Since in the second mode, first sound in the high-frequency range may be reinforced using the fourth sound generator 240, 3.1 channels of stereo sound may be provided.

Figure 24:
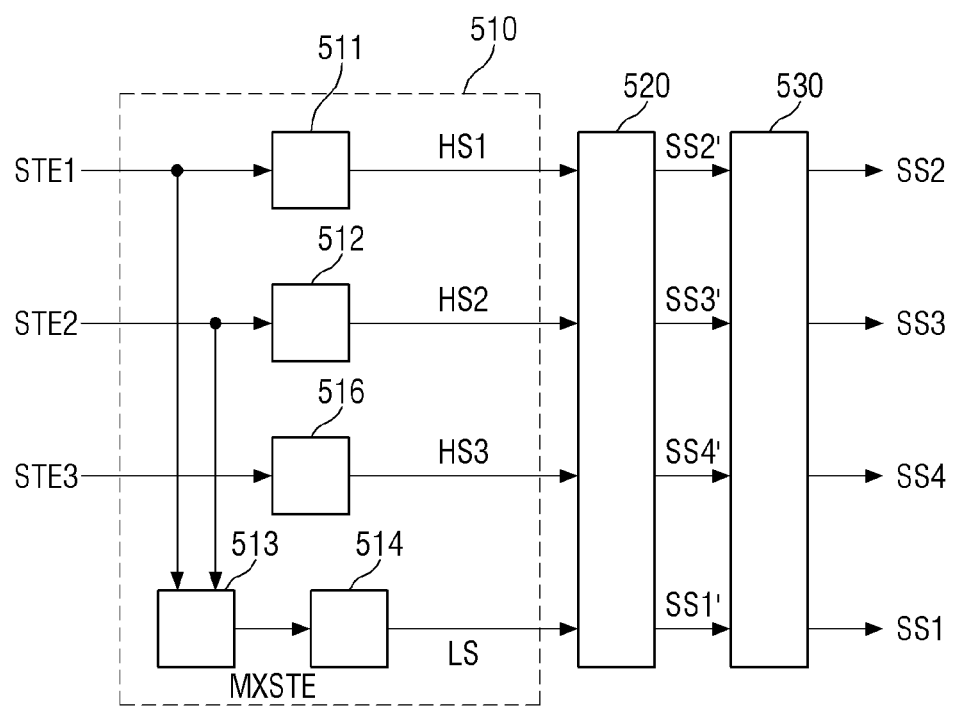
FIG. 24 shows a block diagram illustrating a sound driver according to another embodiment of the disclosure.

FIG. 24 shows a block diagram illustrating a sound driver according to another embodiment of the disclosure.

A sound driver 171 of FIG. 24 may differ from the sound driver 171 of FIG. 13 in that a digital signal processing unit 510 may further include a third high-pass filter 516 and may not include a stereo signal modulator 515.

Referring to FIG. 24, the digital signal processing unit 510 may include a first high-pass filter 511, a second high-pass filter 512, a stereo signal mixer 513, a low-pass filter 514, and the third high-pass filter 516.

The first and second high-pass filters 511 and 512 may be substantially the same as their respective counterparts of FIG. 13, and thus, detailed descriptions thereof will be omitted.

The third high-pass filter 516 may be a filter capable of filtering a sound signal having a fourth threshold frequency or higher. Thus, low-frequency sound signals having a frequency lower than the fourth threshold frequency may be removed. For example, the third high-pass filter 516 may lower the sound pressure of low-frequency sound signals having a frequency lower than the fourth threshold frequency. The third high-pass filter 516 may output a third high-frequency signal HS3 by filtering a signal in a third high-frequency range from a third stereo signal STE3. The fourth threshold frequency may be substantially the same as a first threshold frequency. The third high-frequency range may be substantially the same as a first high-frequency range. The third high-frequency signal HS3 may be a signal including central stereo sound in a high-frequency range.

In a first mode, the stereo signal mixer 513 may receive first and second stereo signals STE1 and STE2. In the first mode, the stereo signal mixer 513 may generate a mixed stereo signal MXSTE by mixing the first and second stereo signals STE1 and STE2, which may be for outputting right stereo sound and left stereo sound, respectively.

In a second mode, the stereo signal mixer 513 may receive the first, second, and third stereo signals STE1, STE2, and STE3. In the second mode, the stereo signal mixer 513 may generate the mixed stereo signal MXSTE by mixing the first, second, and third stereo signals STE1, STE2, and STE3, which may be for outputting right stereo sound, left stereo sound, and central stereo sound, respectively.

The low-pass filter 514 may output a mixed low-frequency signal LS by filtering a sound signal in a low-frequency range from the mixed stereo signal MXSTE. In the first mode, the mixed stereo signal MXSTE may be generated by mixing the first and second stereo signals STE1 and STE2. Thus, the mixed low-frequency signal LS may be a signal including right stereo sound in the low-frequency range and left stereo sound in the low-frequency range. In the second mode, the mixed stereo signal MXSTE may be generated by mixing the first, second, and third stereo signals STE1, STE2, and STE3. Thus, the mixed low-frequency signal LS may be a signal including the right stereo sound in the low-frequency range, left stereo sound in the low-frequency range, and central stereo sound in the low-frequency range.

A digital-to-analog converter 520 may receive a first high-frequency signal HS1, a second high-frequency signal HS2, the third high-frequency signal HS3, and the mixed low-frequency signal LS. The digital-to-analog converter 520 may convert the mixed low-frequency signal LS, which may be a digital signal, into a first analog signal SS1', and may convert the first high-frequency signal HS1, which may be a digital signal, into a second analog signal SS2'. The digital-to-analog converter 520 may convert the second high-frequency signal HS2, which may be a digital signal, into a third analog signal SS3', and may convert the third high-frequency signal HS3, which may be a digital signal, into a fourth analog signal SS4'. The digital-to-analog converter 520 may output the first, second, third, and fourth analog signals SS1', SS2', SS3', and SS4' to an amplifier 530.

The amplifier 530 may output first, second, third, and fourth sound signals SS1, SS2, SS3, and SS4 by amplifying the first, second, third, and fourth analog signals SS1', SS2', SS3', and SS4' using multiple amplifiers. Each of the multiple amplifiers may include an operational amplifier. The amplifier 530 may output the first, second, third, and fourth sound signals SS1, SS2, SS3, and SS4 to the first, second, third, and fourth sound generators 210, 220, 230, and 240, respectively.

The digital signal processing unit 510 may further include a stereo signal generator 517, as illustrated in FIG. 17. The first, second, and third stereo signals STE1, STE2, and STE3 may be replaced with first, second, and third modulated stereo signals MSTE1, MSTE2, and MSTE3 which may be generated by the stereo signal generator 517.

According to the embodiment of FIG. 24, the low-frequency signal LS, which may include the right stereo sound in the low-frequency range, the left stereo sound in the low-frequency range, and the central stereo sound in the low-frequency range, may be converted into the first sound signal SS1, which may be an analog signal, and thus the first sound signal SS1 may be output to the first sound generator 210. The first high-frequency signal HS1, which may include the right stereo sound in the high-frequency range, may be converted into the second sound signal SS2, which may be an analog signal, and thus the second sound signal SS2 may be output to the second sound generator 220. The second high-frequency signal HS2, which may include the left stereo sound in the high-frequency range, may be converted into the third sound signal SS3, which may be an analog signal, and thus the third sound signal SS3 may be output to the third sound generator 230. The third high-frequency signal HS3, which may include the central stereo sound in the high-frequency range, may be converted into the fourth sound signal SS4, which may be an analog signal, and thus the fourth sound signal SS4 may be output to the fourth sound generator 240. Accordingly, since the left stereo sound in each of the high-frequency range and the low-frequency range, the right stereo sound in each of the high-frequency range and the low-frequency range, and the central stereo sound in each of the high-frequency range and the low-frequency range may all be output, high-quality stereo sound may be provided.

According to the embodiment of FIG. 24, since the first sound output by the vibration of the display panel 110 by the first sound generator 210 in the first mode may include sound in the low-frequency range, 2.1 channels of stereo sound may be provided. Since in the second mode, first sound in the high-frequency range may be reinforced using the fourth sound generator 240, 3.1 channels of stereo sound may be provided.

Figure 25:
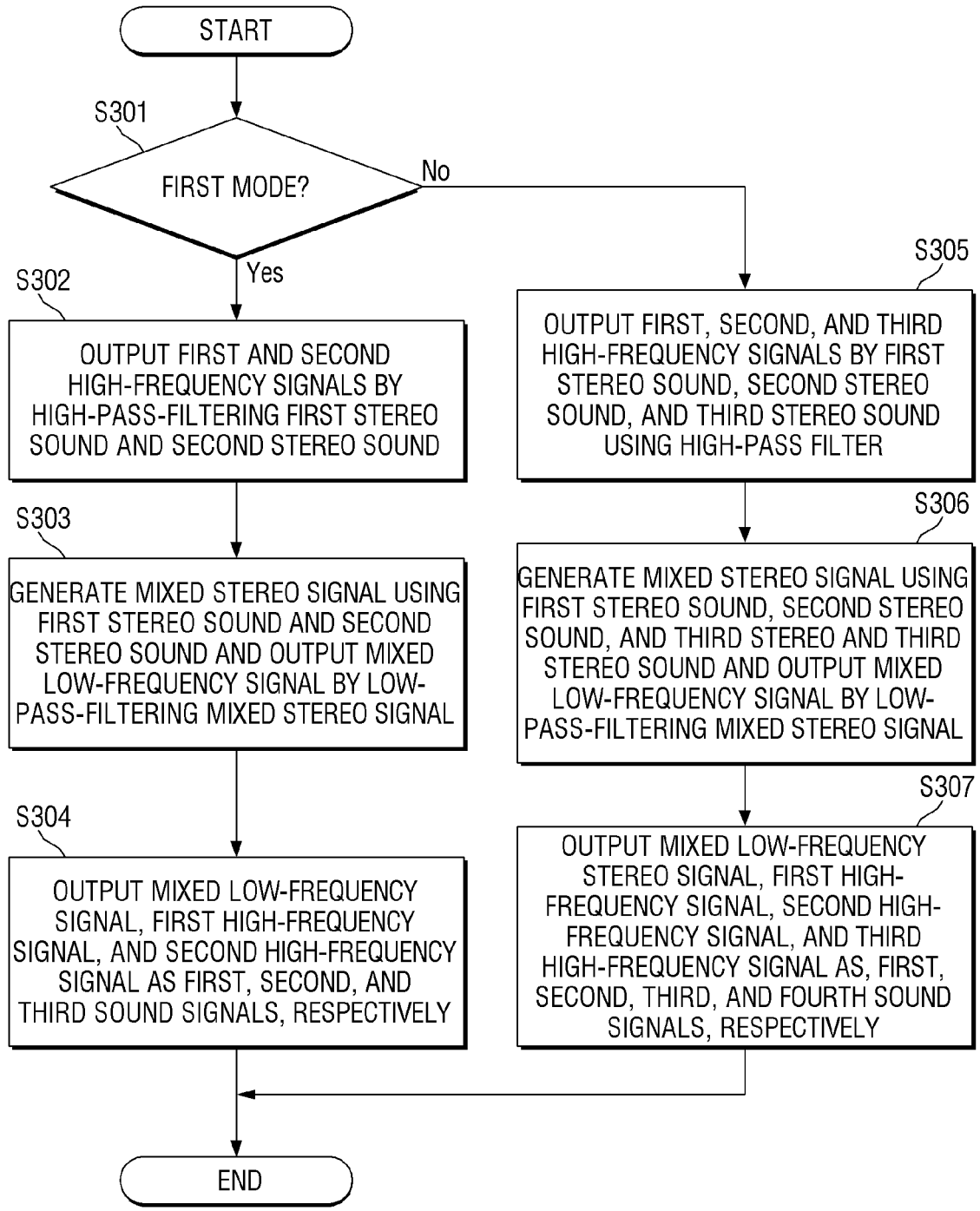
FIG. 25 shows a flowchart illustrating a sound signal output method of the sound driver of FIG. 24.

FIG. 25 shows a flowchart illustrating a sound signal output method of the sound driver of FIG. 24.

A discussion of sound signal output method of the sound driver 171 of FIG. 24 follows below with reference to FIGS. 24 and 25.

S301, S302, S303, and S304 of FIG. 25 may be substantially the same as S101, S102, S103, and S104, respectively, of FIG. 14, and thus, detailed descriptions thereof will be omitted.

Referring to FIGS. 24 and 25, in the second mode, the digital signal processing unit 510 may output the first high-frequency signal HS1 by filtering the first stereo sound STE1 using the first high-pass filter 511, may output the second high-frequency signal HS2 by filtering the second stereo signal STE2 using the second high-pass filter 512, and may output the third high-frequency signal HS3 by filtering the third stereo signal STE3 using the third high-pass filter 516 (S305).

The output of the first and second high-frequency signals HS1 and HS2 in the second mode in S305 may be substantially the same as the output of the first and second high-frequency signals HS1 and HS2 in the first mode in S202 of FIG. 16, and thus, a detailed description thereof will be omitted.

The third high-pass filter 516 may output the third high-frequency signal HS3 by filtering a sound signal in the third high-frequency range from the third stereo signal STE3. The third high-frequency signal HS3 may be a signal including the central stereo sound in the high-frequency range.

In the second mode, the digital signal processing unit 510 may generate the mixed stereo signal MXSTE by mixing the first, second, and third stereo signals STE1, STE2, and STE3 and may output the mixed low-frequency signal LS by filtering the mixed stereo signal MXSTE (S306).

The stereo signal mixer 513 may generate the mixed stereo signal MXSTE by mixing the first, second, and third stereo signals STE1, STE2, and STE3.

The low-pass filter 514 may output the mixed low-frequency signal LS by filtering a sound signal in the low-frequency range from the mixed stereo signal MXSTE. Since the mixed stereo signal MXSTE may be generated by mixing the first, second, and third stereo signals STE1, STE2, and STE3, the mixed low-frequency signal LS may be a signal including the right stereo sound in the low-frequency range, the left stereo sound in the low-frequency range, and the central stereo sound in the low-frequency range.

In the second mode, the sound driver 171 may convert the mixed low-frequency signal LS, which may be a digital signal, into the first sound signal SS1, and may output the first analog signal SS1 to the first sound generator 210. The sound driver 171 may convert the first high-frequency signal HS1, which may be a digital signal, into the second sound signal SS2, which may be an analog signal, and may output the second sound signal SS2 to the second sound generator 220. The sound driver 171 may convert the second high-frequency signal HS2, which may be a digital signal, into the third sound signal SS3, which may be an analog signal, and may output the third sound signal SS3 to the third sound generator 230. The sound driver 171 may convert the fourth high-frequency signal HS4, which may be a digital signal, into the fourth sound signal SS4, which may be an analog signal, and may output the fourth sound signal SS4 to the fourth sound generator 240 (S307).

In the second mode, the digital-to-analog converter 520 may convert the mixed low-frequency signal LS, which may be a digital signal, into the first analog signal SS1', may convert the first high-frequency signal HS1, which may be a digital signal, into the second analog signal SS2', may convert the second high-frequency signal HS2, which may be a digital signal, into the third analog signal SS3', and may convert the third high-frequency signal HS3, which may be a digital signal, into the fourth analog signal SS4'.

The amplifier 530 may output the first, second, third, and fourth sound signals SS1, SS2, SS3, and SS4 by amplifying the first, second, third, and fourth analog signals SS1', SS2', SS3', and SS4' using multiple amplifiers. The amplifier 530 may output the first, second, third, and fourth sound signals SS1, SS2, SS3, and SS4 to the first, second, third, and fourth sound generators 210, 220, 230, and 240, respectively.

According to S305 through S307, the low-frequency signal LS, which may include the right stereo sound in the low-frequency range, the left stereo sound in the low-frequency range, and the central stereo sound in the low-frequency range, may be converted into the first sound signal SS1, which may be an analog signal, and thus the first sound signal SS1 may be output to the first sound generator 210. The first high-frequency signal HS1, which may include the right stereo sound in the high-frequency range, may be converted into the second sound signal SS2, which may be an analog signal, and thus the second sound signal SS2 may be output to the second sound generator 220. The second high-frequency signal HS2, which may include the left stereo sound in the high-frequency range, may be converted into the third sound signal SS3, which may be an analog signal, and thus the third sound signal SS3 may be output to the third sound generator 230. The third high-frequency signal HS3, which may include the central stereo sound in the high-frequency range, may be converted into the fourth sound signal SS4, which may be an analog signal, and thus the fourth sound signal SS4 may be output to the fourth sound generator 240. Accordingly, since the left stereo sound in each of the high-frequency range and the low-frequency range, the right stereo sound in each of the high-frequency range and the low-frequency range, and the central stereo sound in each of the high-frequency range and the low-frequency range may all be output, high-quality stereo sound may be provided.

According to S305 through S307, since the first sound output by the vibration of the display panel 110 by the first sound generator 210 in the first mode may include sound in the low-frequency range, 2.1 channels of stereo sound may be provided. Also, since in the second mode, first sound in the high-frequency range may be reinforced by using the fourth sound generator 240, 3.1 channels of stereo sound may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
    a display panel including a substrate and a pixel array layer disposed on a first surface of the substrate;
    a first sound generator disposed on a second surface of the substrate, which is opposite to the first surface of the substrate, the first sound generator being configured to vibrate the display panel in accordance with a first sound signal to output first sound;
    a second sound generator disposed on the second surface of the substrate, the second sound generator being configured to vibrate the display panel in accordance with a second sound signal to output second sound;
    a third sound generator disposed on the second surface of the substrate, the third sound generator configured to vibrate the display panel in accordance with a third sound signal to output third sound; and
    a sound driver, wherein
    the first sound includes both sound in a low-frequency range and sound in a high-frequency range, which is higher than the low-frequency range, and the second sound includes sound in the high-frequency range, and the third sound includes sound in the high-frequency range, wherein the sound driver includes a digital signal processor configured to:
  calculate first and second high-frequency signals by high-pass-filtering first and second stereo signals, respectively,
  generate a mixed stereo signal by mixing the first and second stereo signals,
  calculate a mixed low-frequency signal by low-pass filtering the mixed stereo signal,
  output the mixed low-frequency signal in a first mode, and
  output a modulated stereo signal by mixing the mixed low-frequency signal and a third stereo signal in a second mode.

2. The display device of claim 1, wherein:
the low-frequency range is less than or equal to about 800 Hz, and the high-frequency range is greater than or equal to about 800 Hz.

3. The display device of claim 1, wherein the sound driver is further configured to
generate the first, second, and third sound signals from first and second stereo signals in a first mode, and
generate the first, second, and third sound signals from the first stereo signal, the second stereo signal, and a third stereo signal in a second mode.

4. The display device of claim 3, wherein the sound driver further includes:
a digital-to-analog converter, which in the first mode, is configured to
  convert the mixed low-frequency signal into a first analog signal,
  convert the first high-frequency signal into a second analog signal, and
  convert the second high-frequency signal into a third analog signal; and
an amplifier, which in the first mode, is configured to
  amplify the first analog signal into the first sound signal and output the first sound signal to the first sound generator,
  amplify the second analog signal into the second sound signal and output the second sound signal to the second sound generator, and
  amplify the third analog signal into the third sound signal and output the third sound signal to the third sound generator.

5. The display device of claim 3, wherein the sound driver further includes:
a digital-to-analog converter, which in the second mode, is configured to
  convert the mixed low-frequency signal into a first analog signal,
  convert the first high-frequency signal into a second analog signal, and
  convert the second high-frequency signal into a third analog signal; and
an amplifier, which in the second mode, is configured to
  amplify the first analog signal into the first sound signal and output the first sound signal to the first sound generator,
  amplify the second analog signal into the second sound signal and output the second sound signal to the second sound generator, and
  amplify the third analog signal into the third sound signal and output the third sound signal to the third sound generator.

6. The display device of claim 1, wherein the sound driver is further configured to
generate first, second, and third modulated stereo signals using first and second stereo signals,
generate the first, second, and third sound signals from the first and second modulated stereo signals in a first mode, and
generate the first, second, and third sound signals from the first, second, and third modulated stereo signals in a second mode.

7. The display device of claim 1, wherein
the first sound generator includes a bobbin disposed on the first surface of the substrate, a voice coil around the bobbin, and a magnet disposed on and spaced apart from the bobbin, and
each of the second and third sound generators includes a first electrode to which a first driving voltage is applied, a second electrode to which a second driving voltage is applied, and a piezoelectric material configured to contract or expand in accordance with at least one of the first and second driving voltage.

8. The display device of claim 1, wherein
the second sound generator is closer to a first side of the display panel than is the third sound generator,
the third sound generator is closer to a second side of the display panel, which is opposite the first side, than is the second sound generator, and
the first sound generator is closer to a center of the display panel than are the second and third sound generators.

9. A display device, comprising:
a display panel including a substrate and a pixel array layer disposed on a first surface of the substrate;
a first sound generator disposed on a second surface of the substrate, which is opposite to the first surface of the substrate, the first sound generator being configured to vibrate the display panel in accordance with a first sound signal to output first sound;
a second sound generator disposed on the second surface of the substrate, the second sound generator being configured to vibrate the display panel in accordance with a second sound signal to output second sound;
a third sound generator disposed on the second surface of the substrate, the third sound generator being configured to vibrate the display panel in accordance with a third sound signal to output third sound; and
a sound driver, wherein
the sound driver includes:
a digital signal processor, which in a second mode, is configured to
  calculate first, second, and third high-frequency signals by high-pass-filtering first, second, and third stereo signals, respectively,
  calculate first, second, and third low-frequency signals by low-pass-filtering the first, second, and third stereo signals, respectively,
  generate a mixed stereo signal by mixing the first and second stereo signals, calculate a mixed low-frequency signal by low-pass-filtering the mixed stereo signal,
  generate a mixed low-frequency signal by mixing the first, second, and third low-frequency signals, and
  generate a modulated stereo signal by mixing the third high-frequency signal and the mixed low-frequency signal;

a digital-to-analog converter, which in the second mode, is configured to
    convert the mixed low-frequency signal into a first analog signal,
    convert the first high-frequency signal into a second analog signal, and
    convert the second high-frequency signal into a third analog signal; and
an amplifier, which in the second mode, is configured to
    amplify the first analog signal into the first sound signal and output the first sound signal to the first sound generator,
    amplify the second analog signal into the second sound signal and output the second sound signal to the second sound generator, and
    amplify the third analog signal into the third sound signal and output the third sound signal to the third sound generator.

10. A display device, comprising:
a display panel including a substrate and a pixel array layer disposed on a first surface of the substrate;
a first sound generator disposed on a second surface of the substrate, which is opposite to the first surface of the substrate, the first sound generator being configured to vibrate the display panel in accordance with a first sound signal to output first sound;
a second sound generator disposed on the second surface of the substrate, the second sound generator being configured to vibrate the display panel in accordance with a second sound signal to output second sound; and
a fourth sound generator disposed on the second surface of the substrate, the fourth sound generator being configured to vibrate the display panel in accordance with a fourth sound signal to reinforce the first sound, wherein
the first sound includes sound in a low-frequency range,
the second sound includes sound in a high-frequency range, which is higher than the low-frequency range,
the first sound generator includes:
    a bobbin disposed on the first surface of the substrate;
    a voice coil disposed around the bobbin; and
    a magnet disposed on and spaced apart from the bobbin, and
the bobbin of the first sound generator is around the fourth sound generator or the bobbin of the first sound generator is on a surface of the fourth sound generator.

11. The display device of claim 10, wherein
a distance between the first and fourth sound generators is smaller than a distance between the first and second sound generators,
a length in a first direction of the fourth sound generator is smaller than a length in the first direction of the second sound generator, and
a length in a second direction of the fourth sound generator is smaller than a length in the second direction of the second sound generator.

12. The display device of claim 10, further comprising:
a third sound generator disposed on the second surface of the first substrate, the third sound generator being configured to vibrate the display panel in accordance with a third sound signal to output third sound,
wherein the third sound includes sound in the high-frequency range.

13. The display device of claim 12, wherein
the low-frequency range is less than or equal to about 800 Hz, and the high-frequency range is greater than or equal to about 800 Hz.

14. The display device of claim 12, wherein
a distance between the first and fourth sound generators is smaller than a distance between the first and third sound generators,
a length in a first direction of the fourth sound generator is smaller than a length in the first direction of the third sound generator, and
a length in a second direction of the fourth sound generator is smaller than a length in the second direction of the third sound generator.

15. The display device of claim 12, further comprising:
a sound driver configured to
    generate the first, second, and fourth sound signals from first and second stereo signals in a first mode, and
    generate the first, second, third, and fourth sound signals from the first stereo signal, the second stereo signal, and a third stereo signal in a second mode.

16. The display device of claim 15, wherein the sound driver includes:
a digital signal processor, which in the second mode, is configured to
    calculate first, second, and third high-frequency signals from the first, second, and third stereo signals, respectively,
    generate a mixed stereo signal by mixing the first, second, and third stereo signals, and
    calculate a mixed low-frequency signal by low-pass-filtering the mixed stereo signal;
a digital-to-analog converter, which in the second mode, is configured to
    convert the mixed low-frequency signal into a first analog signal,
    convert the first high-frequency signal into a second analog signal,
    convert the second high-frequency signal into a third analog signal, and
    convert the third high-frequency signal into a fourth analog signal; and
an amplifier, which in the second mode, is configured to
    amplify the first analog signal into the first sound signal and output the first sound signal to the first sound generator,
    amplify the second analog signal into the second sound signal and output the second sound signal to the second sound generator,
    amplify the third analog signal into the third sound signal and output the third sound signal to the third sound generator, and
    amplify the fourth analog signal into the fourth sound signal and output the fourth sound signal to the fourth sound generator.

17. The display device of claim 10, wherein
each of the second and fourth sound generators includes
    a first electrode to which a first driving voltage is applied,
    a second electrode to which a second driving voltage is applied, and
    a piezoelectric material configured to contract or expand in accordance with at least one of the first and second driving voltage.

18. A sound providing method, comprising:
in a first mode
    calculating a first high-frequency signal, a second high-frequency signal, and a mixed low-frequency signal from first stereo sound and second stereo sound, converting the mixed low-frequency signal into a first sound signal and outputting the first sound signal to a first sound generator, converting the first high-frequency signal into a second sound signal and outputting the second sound signal to a second sound generator, and converting the second high-frequency signal into a third sound signal and outputting the third sound signal to a third sound generator; and in a second mode calculating the first high-frequency signal, the second high-frequency signal, and a modulated stereo signal from the first stereo signal, the second stereo signal, and a third stereo signal, converting the modulated stereo signal into the first sound signal and outputting the first sound signal to the first sound generator, converting the first high-frequency signal into the second sound signal and outputting the second sound signal to the second sound generator, and converting the second high-frequency signal into the third sound signal and outputting the third sound signal to the third sound generator.

* * * * *